US012513985B2

(12) United States Patent
Xie et al.

(10) Patent No.: US 12,513,985 B2
(45) Date of Patent: Dec. 30, 2025

(54) CFET WITH INDEPENDENT GATE CONTROL AND LOW PARASITIC CAPACITANCE

(71) Applicant: International Business Machines Corporation, Armonk, NY (US)

(72) Inventors: Ruilong Xie, Niskayuna, NY (US); Carl Radens, LaGrangeville, NY (US); Kangguo Cheng, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 667 days.

(21) Appl. No.: 17/510,703

(22) Filed: Oct. 26, 2021

(65) Prior Publication Data

US 2023/0125316 A1   Apr. 27, 2023

(51) Int. Cl.
*H10D 84/85* (2025.01)
*H01L 21/02* (2006.01)
(Continued)

(52) U.S. Cl.
CPC ....... *H10D 84/856* (2025.01); *H01L 21/0259* (2013.01); *H10D 30/031* (2025.01);
(Continued)

(58) Field of Classification Search
CPC ............. H01L 27/0922; H01L 29/0665; H01L 29/41733; H01L 29/42392;
(Continued)

(56) References Cited

U.S. PATENT DOCUMENTS 9,837,414 B1   12/2017   Balakrishnan et al.
10,192,819 B1   1/2019   Chanemougame et al.
(Continued)

FOREIGN PATENT DOCUMENTS

DE   112022004262 T5   6/2024
GB   2626690 A   7/2024
WO   2023/072039 A1   5/2023

OTHER PUBLICATIONS

International Search Report dated Jan. 12, 2023, received in a corresponding foreign application, 9 pages.
(Continued)

*Primary Examiner* — Jesse Y Miyoshi
*Assistant Examiner* — Ricky Verdes
(74) *Attorney, Agent, or Firm* — Scully, Scott, Murphy & Presser, P.C.; Samuel Waldbaum

(57) ABSTRACT

A semiconductor structure is provided that includes a second nanosheet device of a second conductivity type stacked over a first nanosheet device of a first conductivity type that is different from the second conductivity type. Each of the first and second nanosheet devices includes at least one semiconductor channel material nanosheet. One side of the least one semiconductor channel material nanosheet of both the first and second nanosheet devices contacts a dielectric material, while another side of the least one semiconductor channel material nanosheet of both the first and second nanosheet devices contacts a functional gate-containing liner that extends laterally to connect to a gate contact of each first and second nanosheet device.

16 Claims, 19 Drawing Sheets

(51) Int. Cl.
  *H10D 30/01* (2025.01)
  *H10D 30/67* (2025.01)
  *H10D 62/10* (2025.01)
  *H10D 64/01* (2025.01)
  *H10D 84/01* (2025.01)
  *H10D 84/03* (2025.01)

(52) U.S. Cl.
  CPC ..... *H10D 30/6713* (2025.01); *H10D 30/6729* (2025.01); *H10D 30/6735* (2025.01); *H10D 30/6757* (2025.01); *H10D 62/118* (2025.01); *H10D 64/018* (2025.01); *H10D 84/0167* (2025.01); *H10D 84/017* (2025.01); *H10D 84/0186* (2025.01); *H10D 84/0188* (2025.01); *H10D 84/038* (2025.01)

(58) Field of Classification Search
  CPC ......... H01L 29/78618; H01L 29/78696; H01L 29/0673; H10D 84/856; H10D 30/6757; H10D 84/0167; H10D 84/0188; H10D 84/038; H10D 84/0172
  See application file for complete search history.

(56) References Cited

U.S. PATENT DOCUMENTS

| | | |
|---|---|---|
| 10,192,867 B1 | 1/2019 | Frougier et al. |
| 10,483,166 B1 | 11/2019 | Cheng et al. |
| 10,510,622 B1 | 12/2019 | Frougier et al. |
| 2019/0057867 A1 | 2/2019 | Smith et al. |
| 2019/0131394 A1 | 5/2019 | Reznicek et al. |
| 2019/0172755 A1 | 6/2019 | Smith et al. |
| 2019/0319021 A1 | 10/2019 | Xu et al. |
| 2020/0118891 A1 | 4/2020 | Cheng et al. |
| 2020/0203341 A1* | 6/2020 | Barraud .......... H01L 21/823807 |
| 2020/0402984 A1 | 12/2020 | Reznicek et al. |
| 2021/0265345 A1 | 8/2021 | Xie et al. |
| 2022/0037509 A1* | 2/2022 | Huang ................ H01L 27/0886 |

OTHER PUBLICATIONS

Prasad, D., et al., "Buried Power Rails and Back-side Power Grids: Arm® CPU Power Delivery Network Design Beyond 5nm", 2019 IEEE International Electron Devices Meeting (IEDM), Dec. 7-11, 2019, 4 pages.

Ryckaert, J., et al., "The Complementary FET (CFET) for CMOS Scaling Beyond N3", 2018 Symposium on VLSI Technology Digest of Technical Papers, Date of Conference: pp. 141-142, Jun. 18-22, 2018.

* cited by examiner

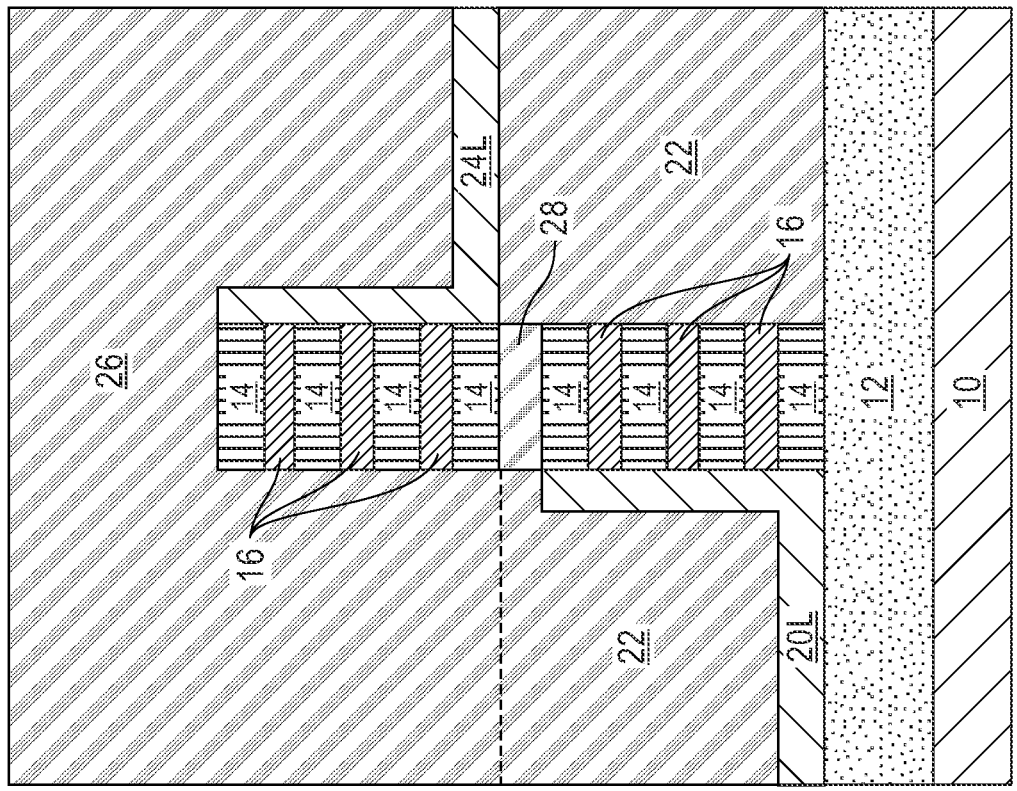
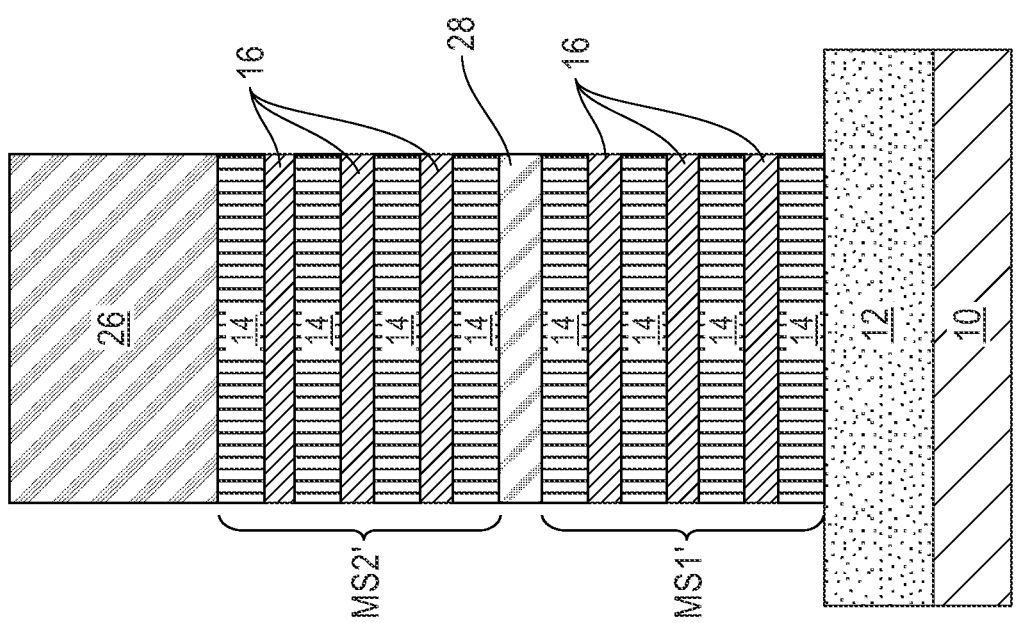
FIG. 9B
FIG. 9A

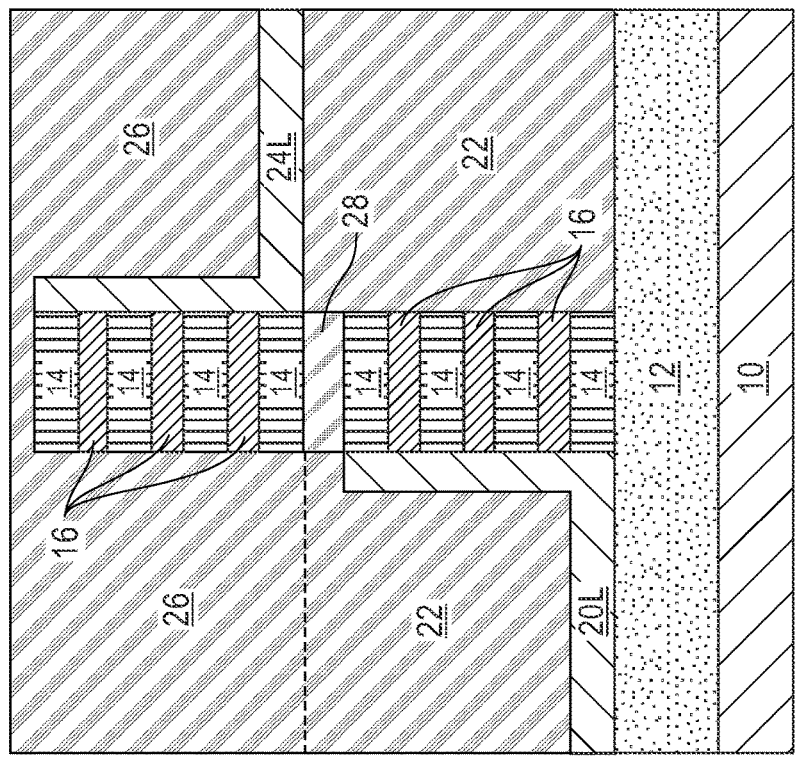
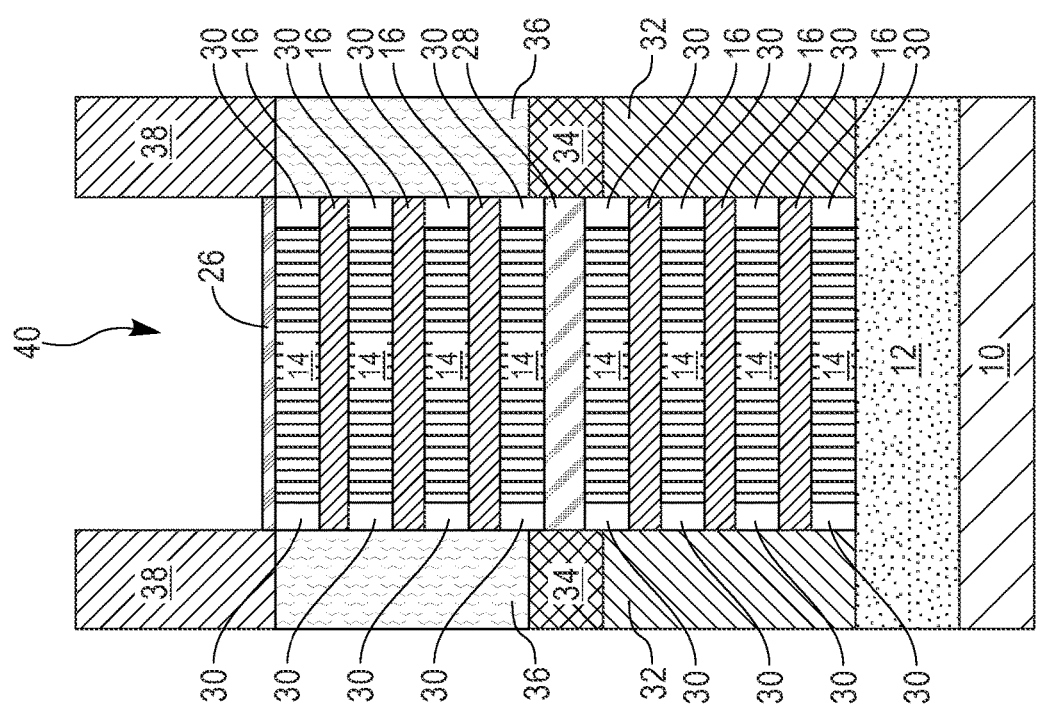
FIG. 13B
FIG. 13A

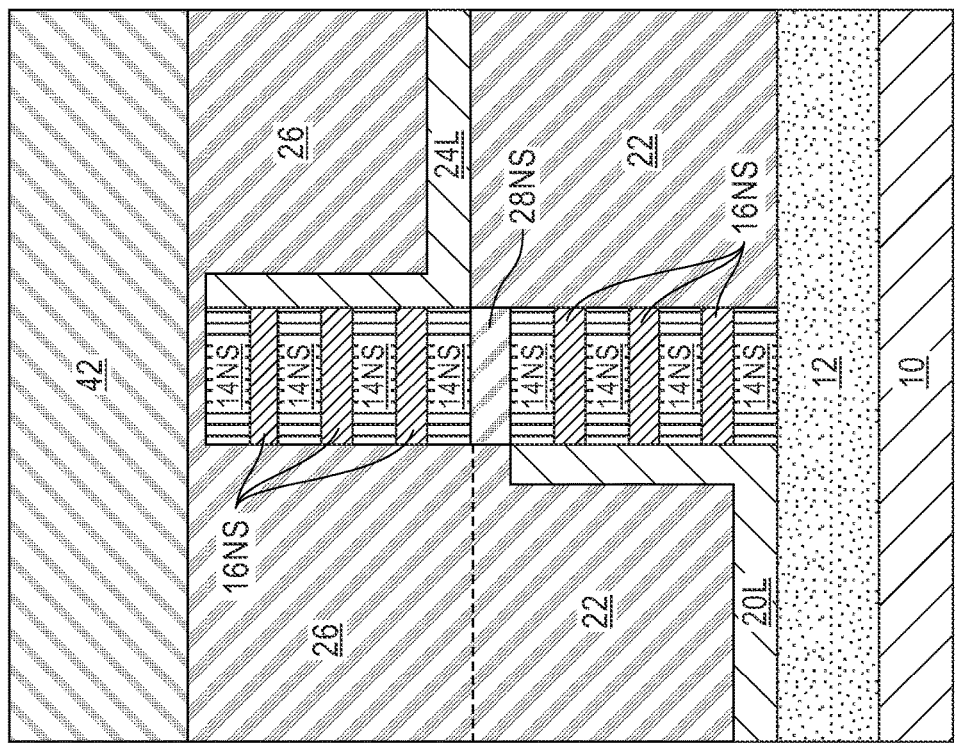
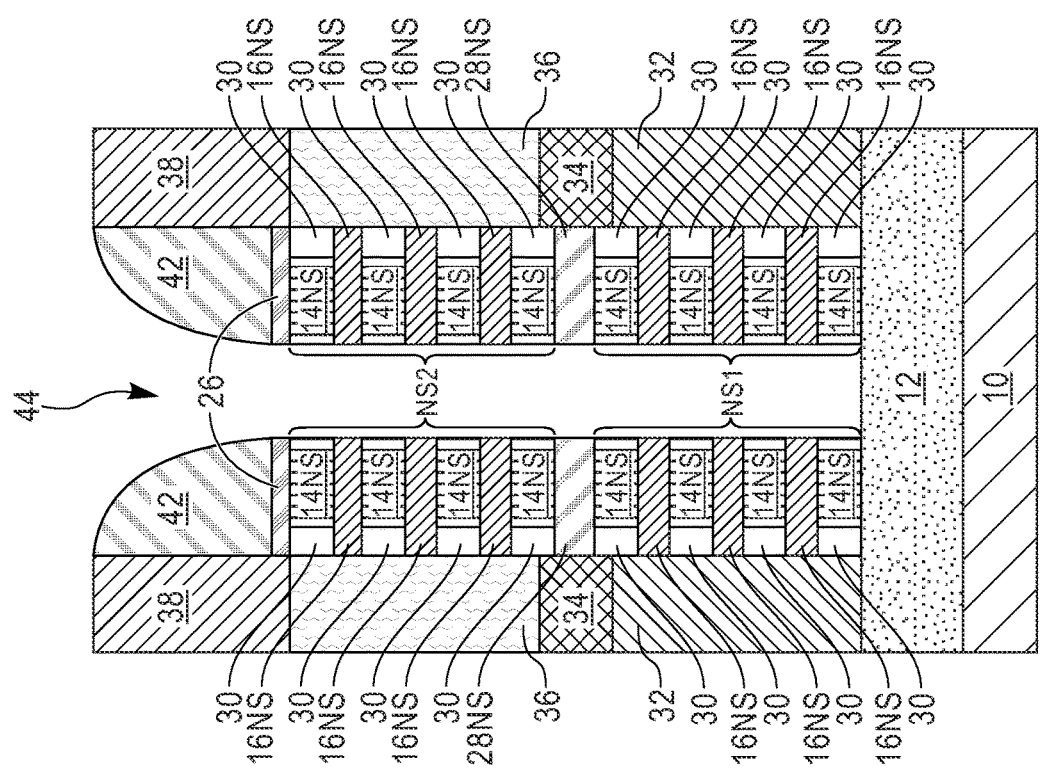
FIG. 14B
FIG. 14A

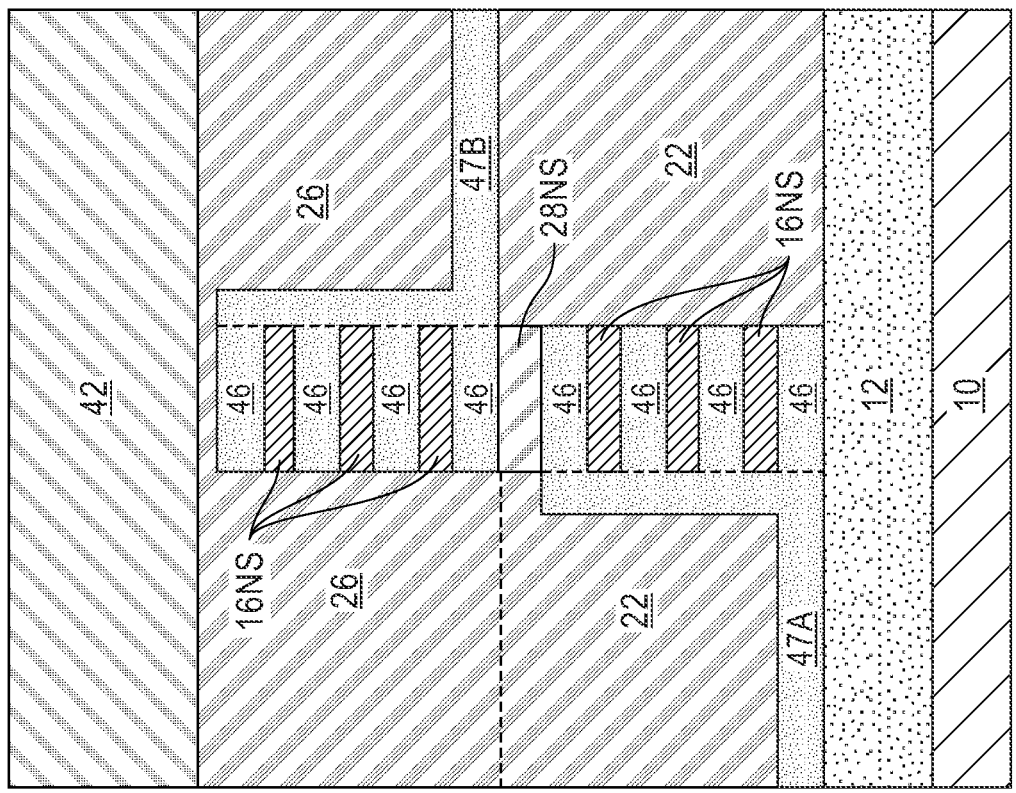
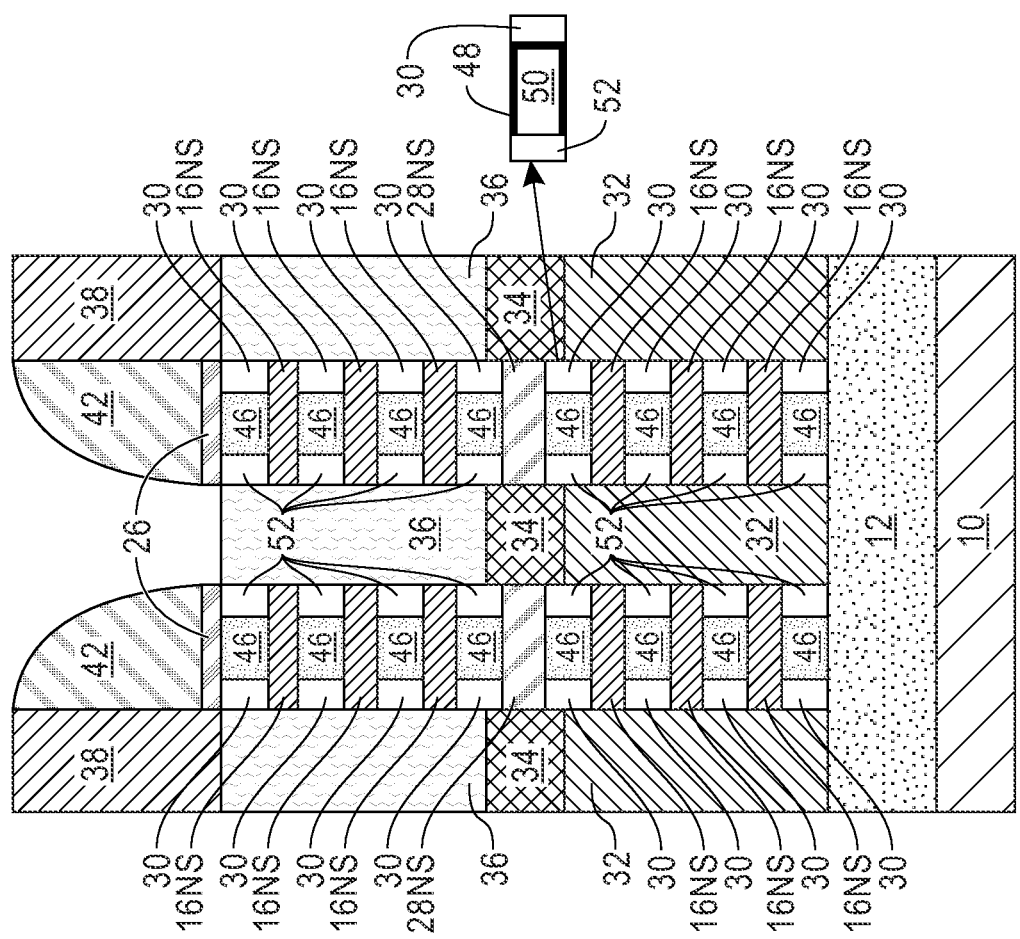
FIG. 17A
FIG. 17B

CFET WITH INDEPENDENT GATE CONTROL AND LOW PARASITIC CAPACITANCE

BACKGROUND

The present application relates to semiconductor technology, and more particularly to a semiconductor structure containing independent gates for a complementary field effect transistor (CFET) with reduce metal volume for lower parasitic capacitance.

A CFET includes a p-type field effect transistor (PFET) vertically stacked on top of an n-type field effect transistor (NFET) or vice versa. A CFET can utilize tri-gate or gate-all-around technology when stacking NFET and PFET nanosheets on top of each other. Stacking can permit smaller scale devices, but it is very difficult to achieve independent gates for stacked nanosheet CFET devices. Also, a very large gate metal volume is present in conventional CFETs which causes a high parasitic capacitance between the gate and the source/drain regions and/or contact structures. There is thus a need for providing a stacked nanosheet CFET having independent gates and reduce metal volume for lower parasitic capacitance.

SUMMARY

A semiconductor structure is provided that includes a second nanosheet device of a second conductivity type stacked over a first nanosheet device of a first conductivity type that is different from the second conductivity type. Each of the first and second nanosheet devices includes at least one semiconductor channel material nanosheet. One side of the least one semiconductor channel material nanosheet of both the first and second nanosheet devices contacts a dielectric material, while another side of the least one semiconductor channel material nanosheet of both the first and second nanosheet devices contacts a functional gate-containing liner that extends laterally to connect to a gate contact of the first nanosheet device and the second nanosheet device.

In one aspect of the present application, a semiconductor structure is provided. In one embodiment of the present application, the semiconductor structure includes a second nanosheet device of a second conductivity type stacked vertically above a first nanosheet device of a first conductivity type, wherein the first conductivity type is different from the second conductivity type, and each of the first nanosheet device and the second nanosheet device includes at least one suspended semiconductor channel material nanosheet having a first side and a second side that is opposite the first side. A first dielectric material layer contacts the second side of the least one suspended semiconductor channel material nanosheet of the first nanosheet device. A first functional gate-containing liner of a first gate structure contacts the first side of the least one suspended semiconductor channel material nanosheet of the first nanosheet device. A second dielectric material layer is located on a surface of the first dielectric material layer and contacts the first side of the least one suspended semiconductor channel material nanosheet of the second nanosheet device. A second functional gate-containing liner of a second gate structure contacts the second side of the least one suspended semiconductor channel material nanosheet of the second nanosheet device.

In another aspect of the present application, a method of forming a semiconductor structure is provided. In one embodiment of the present application, the method of the present application includes forming a vertical stack of a first nanosheet material stack, a sacrificial placeholder material layer, and a second nanosheet material stack on a surface of a substrate, Next, a first sacrificial liner is formed adjacent to the first nanosheet material stack and on one side of the vertical stack. A second sacrificial liner is then formed adjacent to the second nanosheet material stack and on another side of the vertical stack. After further device processing, the first and second sacrificial liners will be subsequently removed and replaced with a functional gate structure. This method of the present application will become more apparent by referring to the drawings and the detailed description section that follows.

BRIEF DESCRIPTION OF THE DRAWINGS

FIGS. 9A and 9B are cross sectional views of the exemplary semiconductor structure shown in FIGS. 8A and 8B, respectively, after replacing the patterned sacrificial placeholder material layer with a dielectric isolation layer.

FIGS. 13A and 13B are cross sectional views of the exemplary semiconductor structure shown in FIGS. 12A and 12B, respectively, after recessing the second dielectric material layer.

FIGS. 14A and 14B are cross sectional views of the exemplary semiconductor structure shown in FIGS. 13A and 13B, respectively, after forming a top spacer on the recessed second dielectric material layer, and forming an opening through the patterned second nanosheet material stack, the dielectric isolation layer and the patterned first nanosheet material stack utilizing the top spacer as an mask to provide a pair of spaced apart stacked structures, each stacked structure of the pair of stacked structures including a first nanosheet stack and a second nanosheet stack separated by a dielectric isolation nanosheet, and each of the first nanosheet stack and the second nanosheet stacking including alternating sacrificial semiconductor material nanosheets and semiconductor channel material nanosheets.

FIGS. 17A and 17B are cross sectional views of the exemplary semiconductor structure shown in FIGS. 16A and 16B, respectively, after forming second inner spacers, a first source/drain region of the first conductivity, and a second source/drain region of the second conductivity, different from the first conductivity, in the opening.

DETAILED DESCRIPTION

Figure 1:
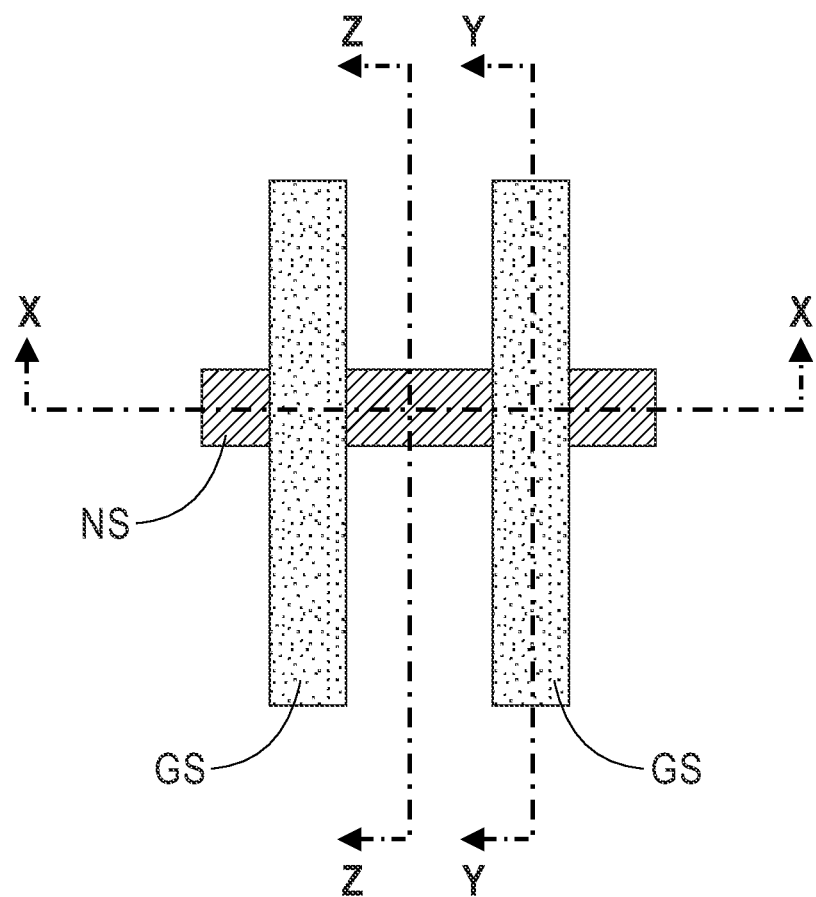
FIG. 1 is a diagram showing a layout including a pair of gate structures that are located on a portion of a nanosheet stack including cuts X-X, Y-Y and Z-Z that will be used in the present application to describe various cross sectional views of the exemplary semiconductor structure of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a diagram showing a layout including a pair of gate structures GS that are located on a portion of a nanosheet stack NS. As is shown, each gate structure GS lies parallel to each other, and each gate structure GS lies perpendicular to the nanosheet stack NS. The layout shown in FIG. 1 further includes cuts X-X, Y-Y and Z-Z. As is illustrated, cut X-X is through one of the nanosheet stacks, cut Y-Y is through one of the gate structures GS, and cut Z-Z is located in an area that is located between the two gate structures GS shown in FIG. 1. These cuts will be used in the present application to describe various cross sectional views of the exemplary semiconductor structure of the present application. Notably, FIGS. 2A, 3A, 4A, 5A, 6A, 7A, 8A, 9A, 10A, 11A, 12A, 13A, 14A, 15A, 16A, 17A and 18A illustrate an exemplary semiconductor structure through different processing steps of the present application through cut X-X illustrated in FIG. 1. FIGS. 2B, 3B, 4B, 5B, 6B, 7B, 8B, 9B, 10B, 11B, 12B, 13B, 14B, 15B, 16B, 17B and 18B illustrate the exemplary semiconductor structure through different processing steps of the present application through cut Y-Y illustrated in FIG. 1. FIG. 18C illustrates the exemplary semiconductor structure through different processing steps of the present application through cut Z-Z illustrated in FIG. 1.

Figure 2B:
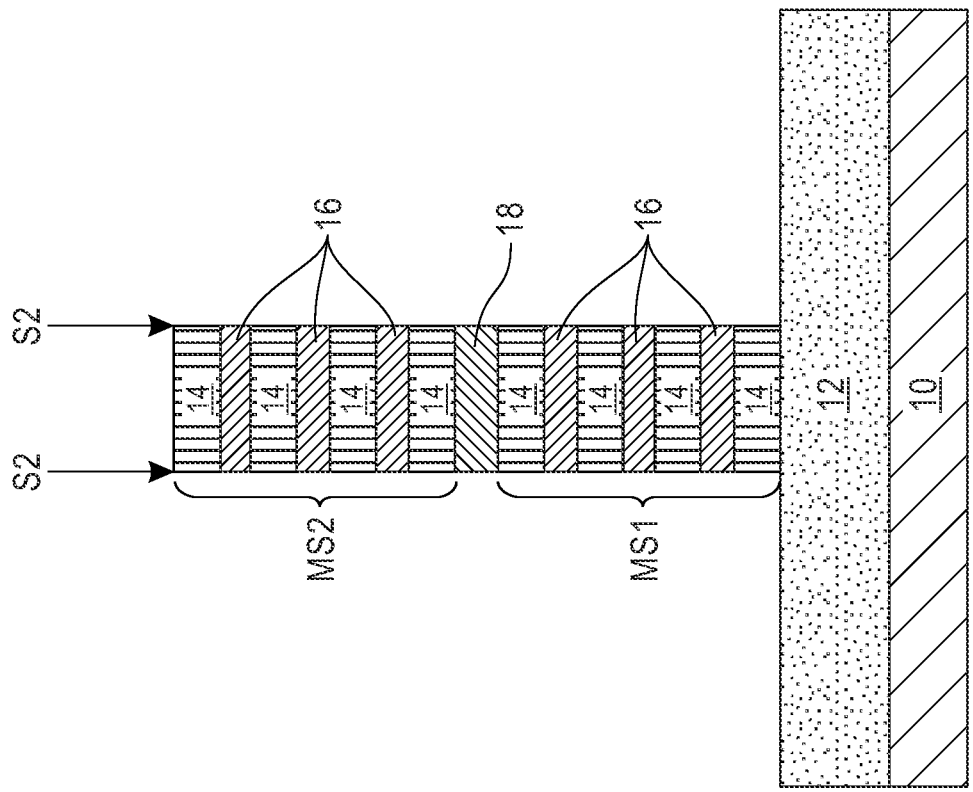
FIGS. 2A and 2B are cross sectional views through X-X and Y-Y, respectively, of an exemplary semiconductor structure that can be employed in the present application, the exemplary semiconductor structure including a sacrificial placeholder material layer sandwiched between a first nanosheet material stack and a second nanosheet material stack, each of the first nanosheet material stack and the second nanosheet material stack including alternating sacrificial semiconductor material layers and semiconductor channel material layers.
Figure 2A:
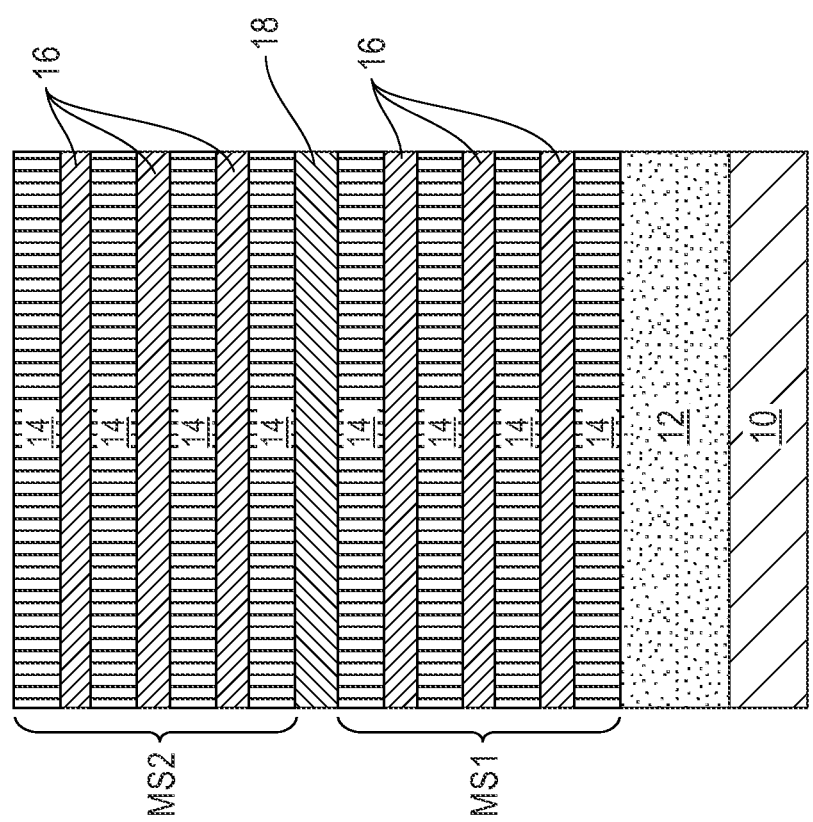

Referring now to FIGS. 2A and 2B, there are illustrated an exemplary semiconductor structure that can be used in the present application and through cut X-X and cut Y-Y, respectively, shown in FIG. 1. The exemplary semiconductor structure includes a sacrificial placeholder material layer 18 that is sandwiched between a first nanosheet material stack MS1 and a second nanosheet material stack MS2. The cross sectional view in FIG. 2A shows the length of the vertical stack containing the first nanosheet material stack MS1, the sacrificial placeholder material layer 18 and the second nanosheet material stack MS2. The cross sectional view in FIG. 2B illustrates the width of the vertical stack containing the first nanosheet material stack MS1, the sacrificial placeholder material layer 18 and the second nanosheet material stack MS2. Although the present application illustrates only a single vertical stack of the first nanosheet material stack MS1, the sacrificial placeholder material layer 18, and the second nanosheet material stack MS2, the present application contemplates embodiments when a plurality of such vertical stacks are employed. As is shown, the vertical stack of the first nanosheet material stack MS1, the sacrificial placeholder material layer 18, and the second nanosheet material stack MS2 has a first side S1 and a second side S2 that is opposite S2.

The vertical stack of the first nanosheet material stack MS1, the sacrificial placeholder material layer 18, and the second nanosheet material stack MS2 is located on a semiconductor substrate 10. In some embodiments (not shown), the vertical stack of the first nanosheet material stack MS1, the sacrificial placeholder material layer 18, and the second nanosheet material stack MS2 is located directly on the semiconductor substrate 10. In other embodiments (and as is illustrated in FIGS. 2A and 2B), the vertical stack of the first nanosheet material stack MS1, the sacrificial placeholder material layer 18, and the second nanosheet material stack MS2 is located directly on a surface of a dielectric material layer 12 that is located on the semiconductor substrate 10. In yet other embodiments (not shown), the vertical stack of the first nanosheet material stack MS1, the sacrificial placeholder material layer 18, and the second nanosheet material stack MS2 is located directly on a surface of another sacrificial placeholder material layer that is located on the semiconductor substrate 10. In such an embodiment, the another sacrificial placeholder material will be replaced with a dielectric material during subsequent processing steps, such, as for example, formation of dielectric isolation layer 28 or top spacer 42 formation, to provide a buried insulator layer.

The semiconductor substrate 10 can be composed of one or more semiconductor materials; is thus a bulk semiconductor substrate. Examples of semiconductor materials that can be used to provide the semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors.

When present, the dielectric material layer 12 is composed of a dielectric material such as, for example, silicon oxide, and/or boron nitride. In such an embodiment, the dielectric material layer 12 and semiconductor substrate 10 can be components of a semiconductor-on-insulator (SOI) substrate.

Each of the first nanosheet material stack MS1 and the second nanosheet material stack MS2 includes alternating sacrificial semiconductor material layers 14 and semiconductor channel material layers 16. The first nanosheet material stack MS1 and the second nanosheet material stack MS2 include 'n' semiconductor channel material layers 16 and 'n+1' sacrificial semiconductor layers 14, wherein n is at least 1. Thus, each semiconductor channel material layer 16 within the first nanosheet material stack MS1 and the second nanosheet material stack MS2 is sandwiched between a bottom sacrificial semiconductor material layer 14 and a top sacrificial semiconductor material layer 14. By way of one example, each of the first nanosheet material stack MS1 and the second nanosheet material stack MS2 includes three semiconductor channel material layers 16 and four sacrificial semiconductor material layers 14. Although the present application illustrates that the first nanosheet material stack MS1 and the second nanosheet material stack MS2 contain a same number of sacrificial semiconductor material layers 14 and semiconductor channel material layers 16, the present application contemplates embodiments when the first nanosheet material stack MS1 includes a different number of sacrificial semiconductor material layers 14 and semiconductor channel material layers 16 than the second nanosheet material stack MS2. For example, the first nanosheet material stack MS1 can contain two semiconductor channel material layers 16 and three sacrificial semiconductor material layers 14, while the second nanosheet material stack MS2 can contain three semiconductor channel material layers 16 and four sacrificial semiconductor material layers 14.

Each sacrificial semiconductor material layer 14 within a given nanosheet material stack is composed of a first semiconductor material, while each semiconductor channel material layer 16 within a given nanosheet material stack is composed of a second semiconductor material that is compositionally different from the first semiconductor material. Typically, but not necessary always, the sacrificial semiconductor material layers 14 in the first nanosheet material stack MS1 are compositionally the same as the sacrificial semiconductor material layers 14 in the second nanosheet material stack MS2. Also typically, but not necessary always, the semiconductor channel material layers 16 in the first nanosheet material stack MS1 are compositionally the same as the semiconductor channel material layers 16 in the second nanosheet material stack MS2. In some embodiments for example, the semiconductor channel material layers 16 present in the first nanosheet stack MS1 are composed of a second semiconductor material capable of providing high channel mobility for NFET devices, while the semiconductor channel material layers 16 present in the second nanosheet stack MS2 are composed of a second semiconductor material capable of providing high channel mobility for PFET devices, or vice versa.

The first semiconductor material that provides each sacrificial semiconductor material layer 14 and the second semiconductor material that provides each semiconductor channel material layer 16 can include one of the semiconductor materials mentioned above for semiconductor substrate 10. In the present application, the first semiconductor material that provides each sacrificial semiconductor material layer 14 can be compositionally the same as, or compositionally different from, at least an uppermost portion of the semiconductor substrate 10. Typically, the first semiconductor material that provides each sacrificial semiconductor material layer 14 is compositionally different from at least the uppermost portion of the semiconductor substrate 10. The second semiconductor material that provides each semiconductor channel material layer 16 can be compositionally the same as, or compositionally different from, at least an uppermost portion of the semiconductor substrate 10. Typically, the second semiconductor material that provides each semiconductor channel material layer 16 is compositionally the same as that of at least the uppermost portion of the semiconductor substrate 10. In one example, the semiconductor substrate 10 is composed of silicon, the first semiconductor material that provides each sacrificial semiconductor material layer 14 is composed of a silicon germanium alloy, and the second semiconductor material that provides each semiconductor channel material layer 16 is composed of silicon. Other combinations of semiconductor materials are possible as long as the first semiconductor material that provides each sacrificial semiconductor material layer 14 is compositionally different from the second semiconductor material that provides each semiconductor channel material layer 16.

The sacrificial placeholder material layer 18 that is sandwiched between the first nanosheet material stack MS1 and the second nanosheet material stack MS2 can be composed of a third semiconductor material that is compositionally different from both the first semiconductor material that provides each sacrificial semiconductor material layer 14 and the second semiconductor material that provides each semiconductor channel material layer 16. In one example, the first semiconductor material that provides each sacrificial semiconductor layer 14 is composed of a silicon germanium alloy in which the germanium content is 30 atomic percent, the second semiconductor material that provides each semiconductor channel material layer 16 is composed of silicon, and the third semiconductor material that provides the sacrificial placeholder material layer 18 is composed of a silicon germanium alloy having a germanium content of 60 atomic percent.

The vertical stack of the first nanosheet material stack MS1, the sacrificial placeholder material layer 18, and the second nanosheet material stack MS2 can be formed by first depositing alternating blanket layers of the sacrificial semiconductor material (i.e., first semiconductor material) and semiconductor channel material (i.e., second semiconductor material) that will be contained in the first nanosheet material stack MS1, second depositing a blanket layer of the sacrificial placeholder material (i.e., the third semiconductor material), and third depositing alternating blanket layers of the sacrificial semiconductor material and semiconductor channel material that will be contained in the second nanosheet material stack MS2. The first depositing, second depositing and third depositing can include a same, or different deposition process including, but not limited to, chemical vapor deposition (CVD), plasma enhanced chemical vapor deposition (PECVD) or epitaxial growth. In one example, the first depositing, second depositing and third depositing each includes an epitaxial growth process. In the present application, the terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). In some embodiments, the epitaxial growth can be performed at a temperature of from 300° C. to 800° C. The epitaxial growth can be performed utilizing any well-known precursor gas or gas mixture. Carrier gases like hydrogen, nitrogen, helium and argon can be used.

After the first depositing, second depositing and third depositing mentioned above, the various blanket deposited layers are patterned by lithography and etching to provide the vertical stack of the first nanosheet material stack MS1, the sacrificial placeholder material layer 18, and the second nanosheet material stack MS2. Within the vertical stack, the first nanosheet material stack MS1 typically has outermost sidewalls that are vertically aligned with outermost sidewall of each of the sacrificial placeholder material layers 18, and the second nanosheet material stack MS2. Within the vertical stack, each sacrificial semiconductor material layer 14, each semiconductor channel material layer 16, and the sacrificial placeholder material layer 18 can have a width from 6 nm to 100 nm, and a height (i.e., vertical thickness) from 5 nm to 20 nm. The vertical thicknesses of each of the sacrificial semiconductor material layers 14, the semiconductor channel material layers 16, and the sacrificial placeholder material layer 18 can be the same or different from each other.

Figure 3B:
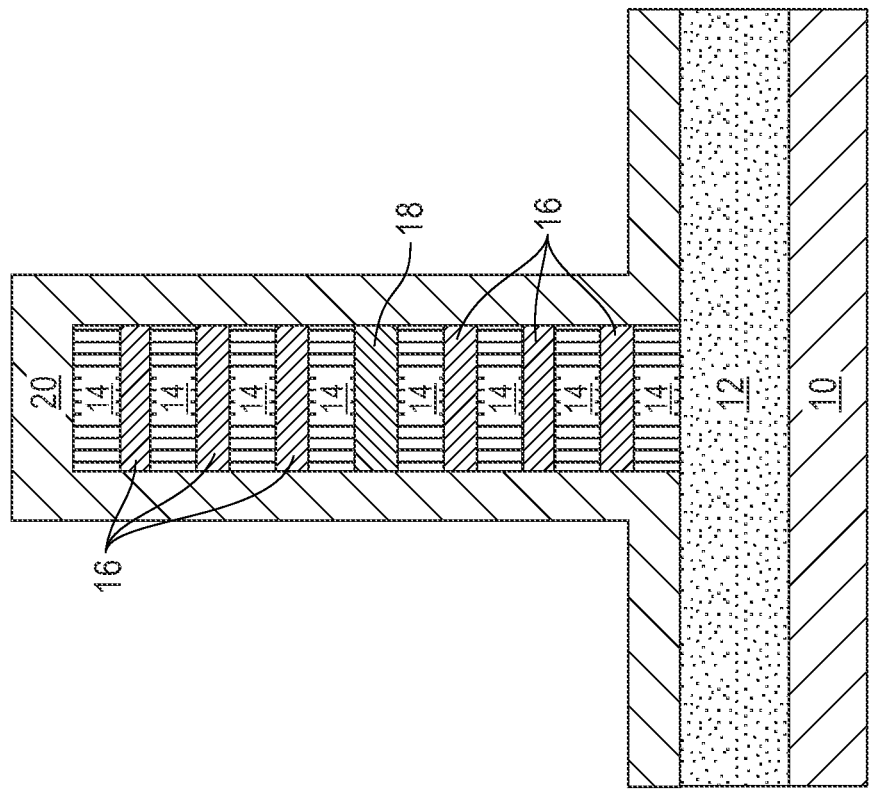
FIGS. 3A and 3B are cross sectional views of the exemplary semiconductor structure shown in FIGS. 2A and 2B, respectively, after forming a first sacrificial layer on physically exposed surfaces of the first nanosheet material stack, the sacrificial placeholder material layer, and the second nanosheet material stack.
Figure 3A:
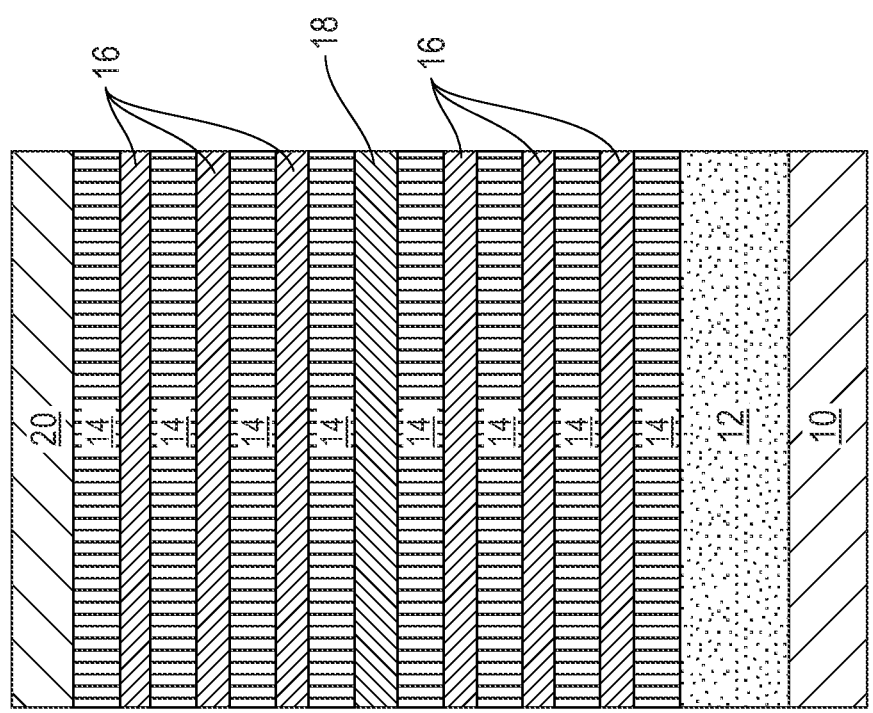

Referring now to FIGS. 3A and 3B, there are illustrated the exemplary semiconductor structure shown in FIGS. 2A and 2B, respectively, after forming a first sacrificial layer 20 on physically exposed surfaces of the first nanosheet material stack MS1, the sacrificial placeholder material layer 18, and the second nanosheet material stack MS2. Notably, the first sacrificial layer 20 is formed on the outermost sidewalls of each of the first nanosheet material stack MS1, the sacrificial placeholder material layer 18, and the second nanosheet material stack MS2, as well as a topmost surface of the second nanosheet material stack MS2.

The first sacrificial layer 20 can be composed of a material, including a dielectric material, a metal, a metal alloy, polysilicon or any like material which can be selectively removed in a subsequent processing step of the present application. In one example, the first sacrificial layer 20 is composed of polysilicon. The first sacrificial layer 20 can be formed by a deposition process including, but not limited to, CVD, PECVD, physical vapor deposition (PVD), or atomic layer deposition (ALD). The first sacrificial layer 20 can have a thickness which can range from 6 nm to 20 nm; although other thicknesses are contemplated and can be used as the thickness of the first sacrificial layer 20. In some embodiments, the first sacrificial layer 20 can be a conformal layer. By "conformal layer" it is meant that a material layer has a thickness along horizontal surfaces that is the same as a thickness of the same material layer along vertical surfaces.

Figure 4B:
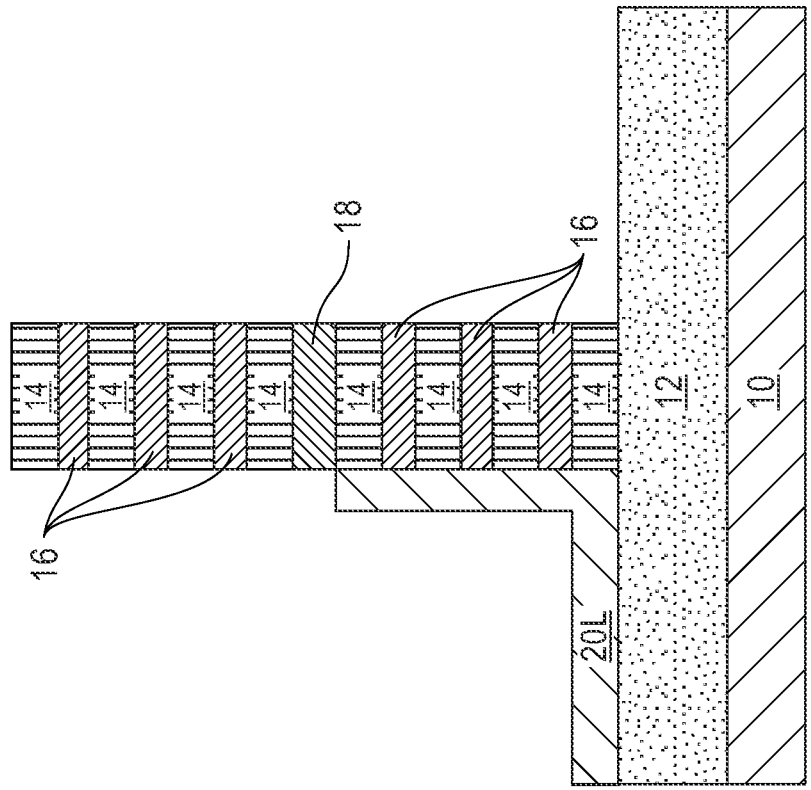
FIGS. 4A and 4B are cross sectional views of the exemplary semiconductor structure shown in FIGS. 3A and 3B, respectively, after patterning the first sacrificial layer to form a first sacrificial liner on a first side of the first nanosheet material stack.
Figure 4A:
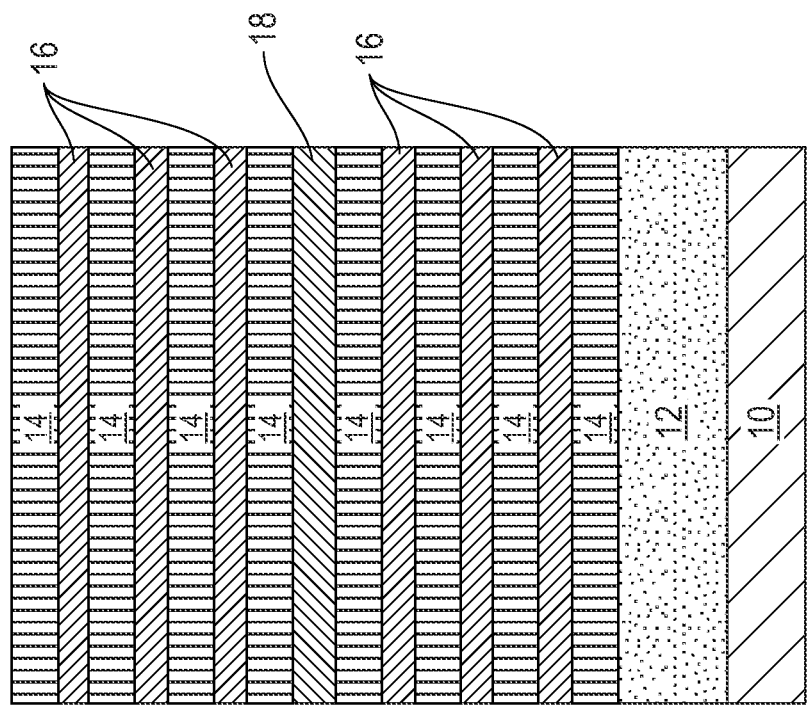

Referring now to FIGS. 4A and 4B, there are illustrated the exemplary semiconductor structure shown in FIGS. 3A and 3B, respectively, after patterning the first sacrificial layer 20 to form a first sacrificial liner 20L on a first side S1 of the first nanosheet material stack MS1. The patterning of the first sacrificial layer 20 can include first forming a first organic planarization layer (OPL) or any other like first masking material to protect a bottom portion of the first sacrificial layer 20 that is located laterally adjacent to the first side S1 and the second side S2 of the first nanosheet material stack MS1; the first OPL or other like first masking material can have a topmost surface that is substantially coplanar (within ±10%) of the topmost surface of the first nanosheet material stack MS1. The first OPL or other like first masking material can be formed by a deposition process, followed by a recess etch. With the first OPL or other like first masking material, portions of the first sacrificial layer 20, not protected by the first OPL or other like first masking material, are removed utilizing an etch that is selective in removing the material that provides the first sacrificial layer 20. The first OPL or other like first masking material is then removed, and thereafter a second OPL or other like second masking material is formed on the first side S1 of the vertical stack, and then another etch is used to remove the portions of the remaining first sacrificial layer 20 from the bottom portion of the second side S2 of the vertical stack. The second OPL or other like second masking material is then removed to provide the exemplary structure shown in FIG. 4B. The removal of the first and second OPL or first and second like masking materials includes any conventional material removal process.

The first sacrificial liner 20L has a topmost surface that is substantially coplanar with the topmost surface of the first nanosheet material stack MS1. In some embodiments, the first sacrificial liner 20L has a topmost surface that is coplanar with a topmost surface of the uppermost sacrificial semiconductor material layer 14 of the first nanosheet material stack MS1. In other embodiments, the first sacrificial liner 20L has a topmost surface that is located between a topmost surface and a bottommost surface of the sacrificial placeholder material layer 18.

The first sacrificial liner 20L has a horizontal portion that is located on a surface of the dielectric material layer 12. When an SOI substrate is not used, the first sacrificial liner 20L has a horizontal portion that is located on a surface of shallow trench isolation region (not shown). The first sacrificial liner 20L has a vertical portion that extends upward from the horizontal portion of the first sacrificial liner 20L. This vertical portion of the first sacrificial liner 20L is located on the outermost sidewall of the first nanosheet material stack MS1 that is on the first side S1 of the vertical stack.

Figure 5B:
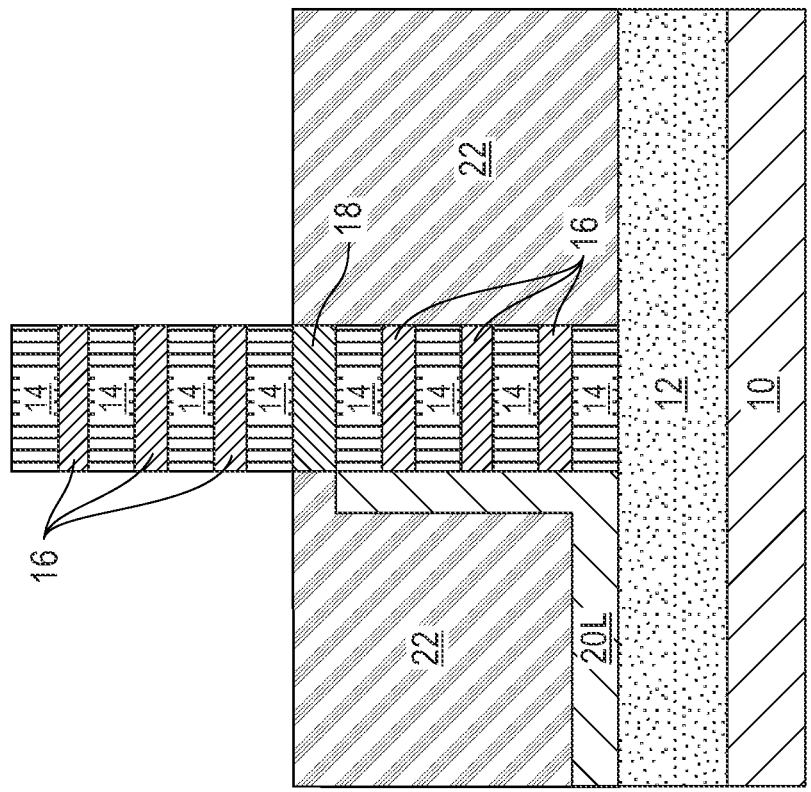
FIGS. 5A and 5B are cross sectional views of the exemplary semiconductor structure shown in FIGS. 4A and 4B, respectively, after forming a first dielectric material layer on the first sacrificial liner and laterally adjacent to the first and second sides of the first nanosheet material stack.
Figure 5A:
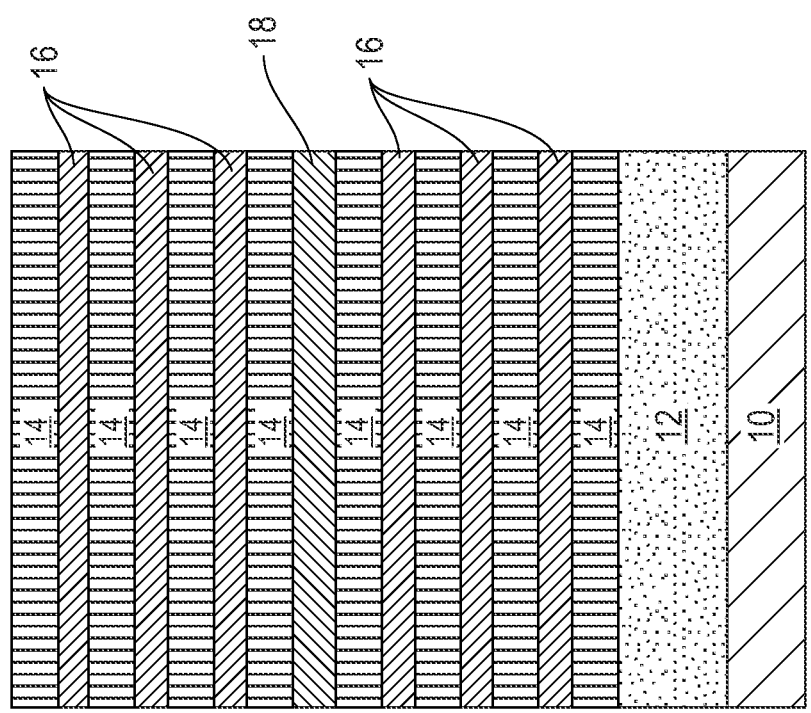

Referring now to FIGS. 5A and 5B, there are shown the exemplary semiconductor structure shown in FIGS. 4A and 4B, respectively, after forming a first dielectric material layer 22 on the first sacrificial liner 20L and laterally adjacent to the first and second sides, S1 and S2, of the first nanosheet material stack MS1. The first dielectric material layer 22 is composed of a dielectric material that is compositionally different from a dielectric material that provides the first sacrificial layer 20. Exemplary dielectric materials that can be used in providing the first dielectric material layer 22 include, but are not limited to, silicon nitride, silicon oxynitride, SiOC, or SiC. The first dielectric material layer 22 can be formed by a deposition process including, for example, CVD, PECVD, PVD, ALD, or spin-on coating. Following the deposition process, an optional planarization process (such as, for example, chemical mechanical polishing (CMP)) can be used to remove any dielectric material from above the topmost surface of the vertical stack. A recess etch is then used to reduce the height of the deposition dielectric material such that the resultant first dielectric material layer 22 has a topmost surface that is substantially coplanar with a topmost surface of the sacrificial placeholder material layer 18. The first dielectric material layer 22 covers an entirety of the first sacrificial liner 20L.

Figure 6B:
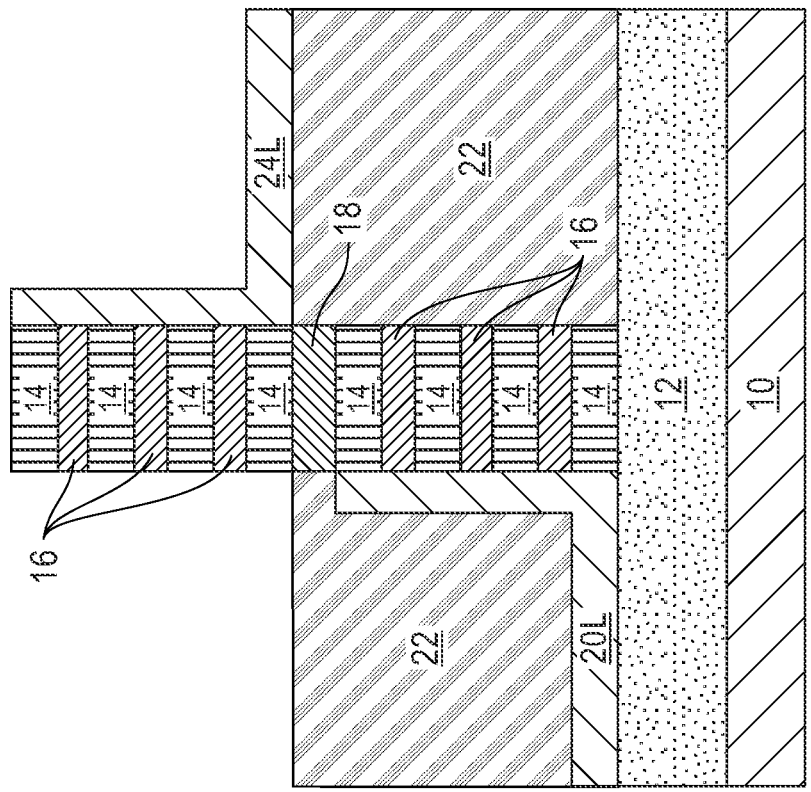
FIGS. 6A and 6B are cross sectional views of the exemplary semiconductor structure shown in FIGS. 5A and 5B, respectively, after forming a second sacrificial liner on a second side of the second nanosheet material stack and on a surface of the first dielectric material layer that is located on a second side of the first nanosheet material stack.
Figure 6A:
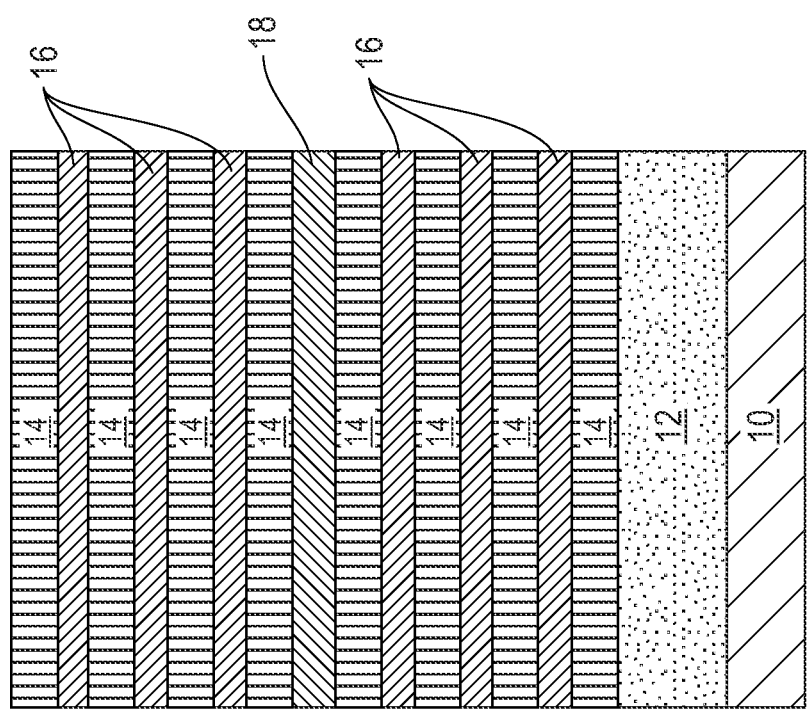

Referring now to FIGS. 6A and 6B, there are illustrated the exemplary semiconductor structure shown in FIGS. 5A and 5B, respectively, after forming a second sacrificial liner 24L on the second side S2 of the second nanosheet material stack MS2 and on a surface of the first dielectric material layer 22 that is located on a second side S2 of the first nanosheet material stack MS1. The second sacrificial liner 24L can include one of the materials mentioned above for the first sacrificial layer 20 that is used in providing the first sacrificial liner 20L. Typically, but not necessarily always, the second sacrificial liner 24L is composed of a compositionally same material as that of the first sacrificial liner 20L.

The second sacrificial liner 24L can be formed by first forming a second sacrificial layer (not shown) on the structure shown in FIGS. 5A and 5B. An OPL or other like masking material is then formed on the second sacrificial layer that is located on the second side S2 of the second nanosheet material stack MS2, an etch is then used to remove the exposed portions of the second sacrificial layer not protected by the OPL or other like masking material, and thereafter the OPL or other like masking material is removed from the structure.

The second sacrificial liner 24L has a topmost surface that is substantially coplanar with a topmost surface the second nanosheet material stack MS2. The second sacrificial liner 24L has a horizontal portion that is located on a topmost surface of the first dielectric material layer 22 that is present on the second side S2 of the vertical stack. The second sacrificial liner 24L has a vertical portion that extends upward from the horizontal portion of the second sacrificial liner 24L. This vertical portion of the second sacrificial liner 24L is located on the outermost sidewall of the second nanosheet material stack MS2 that is on the second side S2 of the vertical stack.

Figure 7B:
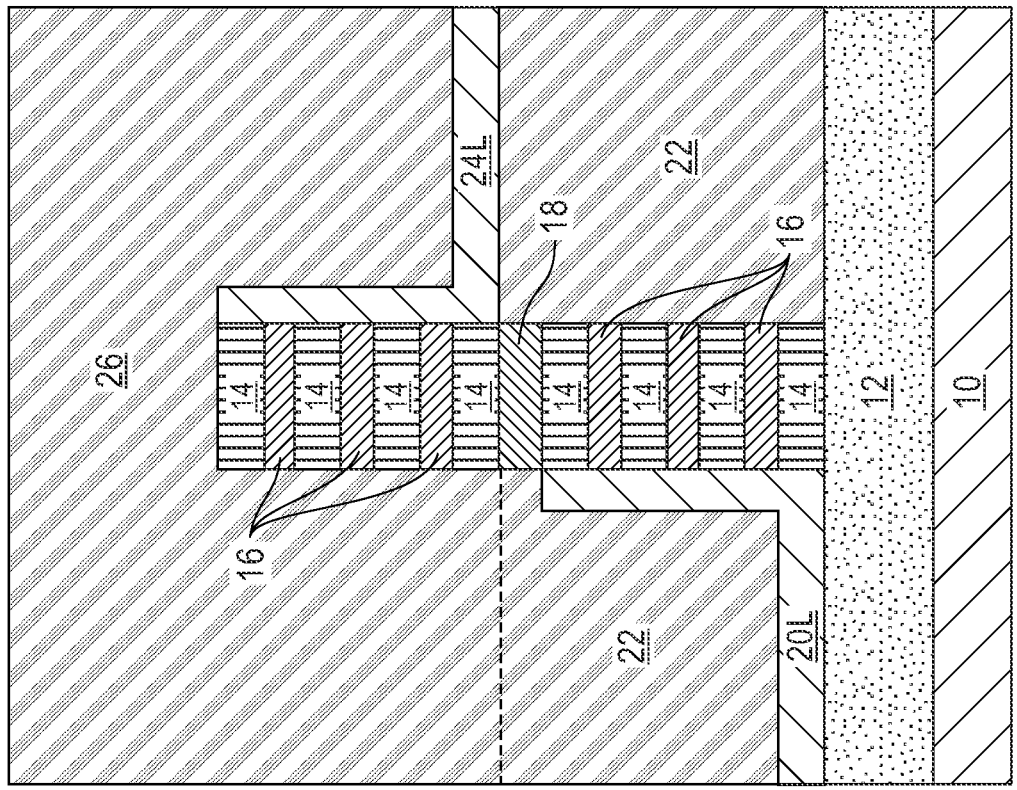
FIGS. 7A and 7B are cross sectional views of the exemplary semiconductor structure shown in FIGS. 6A and 6B, respectively, after forming a second dielectric material layer on the second sacrificial liner and laterally adjacent to the first and second sides of the second nanosheet material stack.
Figure 7A:
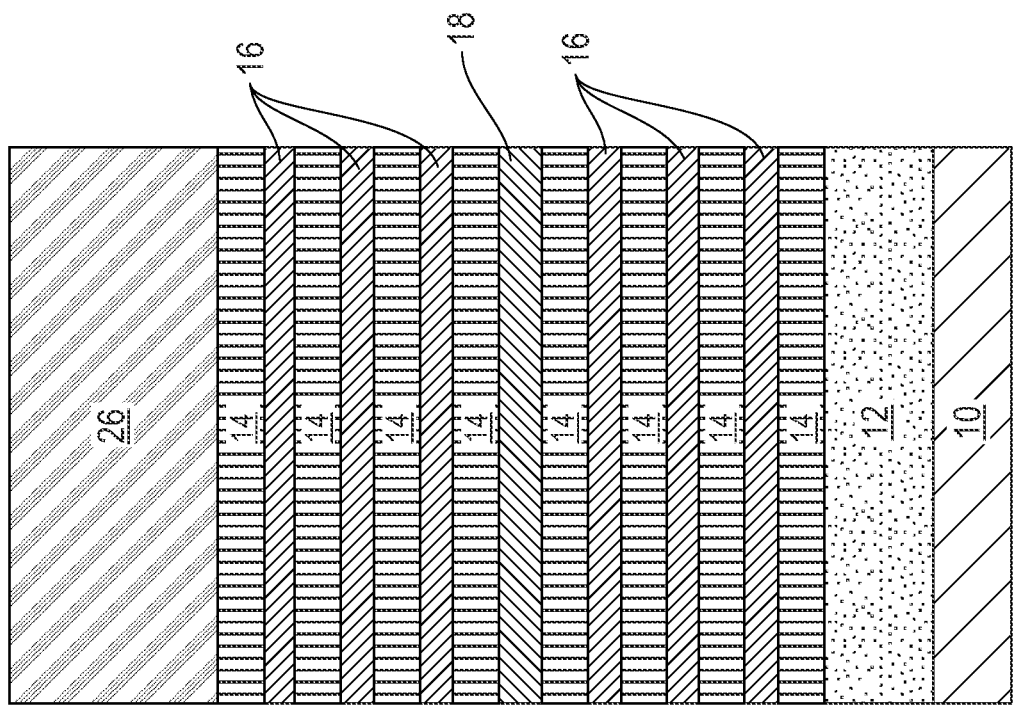

Referring now to FIGS. 7A and 7B, there are illustrated the exemplary semiconductor structure shown in FIGS. 6A and 6B, respectively, after forming a second dielectric material layer 26 on the second sacrificial liner 24L and laterally adjacent to the first and second sides, S1 and S2, of the second nanosheet material stack MS2. The second dielectric material layer 26 is also located above the topmost surface of the vertical stack that includes the first and second nanosheet material stacks, MS1 and MS2.

The second dielectric material layer 26 is composed of a dielectric material that is compositionally different from a dielectric material that provides the first sacrificial layer 20 and the second sacrificial liner 24L. Exemplary dielectric materials that can be used in providing the second dielectric material layer 26 include, but are not limited to, silicon dioxide, silicon nitride or silicon oxynitride. The dielectric material that provides the second dielectric material layer 26 can be compositionally the same as, or compositionally different, from the dielectric material that provides the first dielectric material layer 22. The second dielectric material layer 26 can be formed by a deposition process including, for example, CVD, PECVD, PVD, ALD or spin-on coating.

Figure 8B:
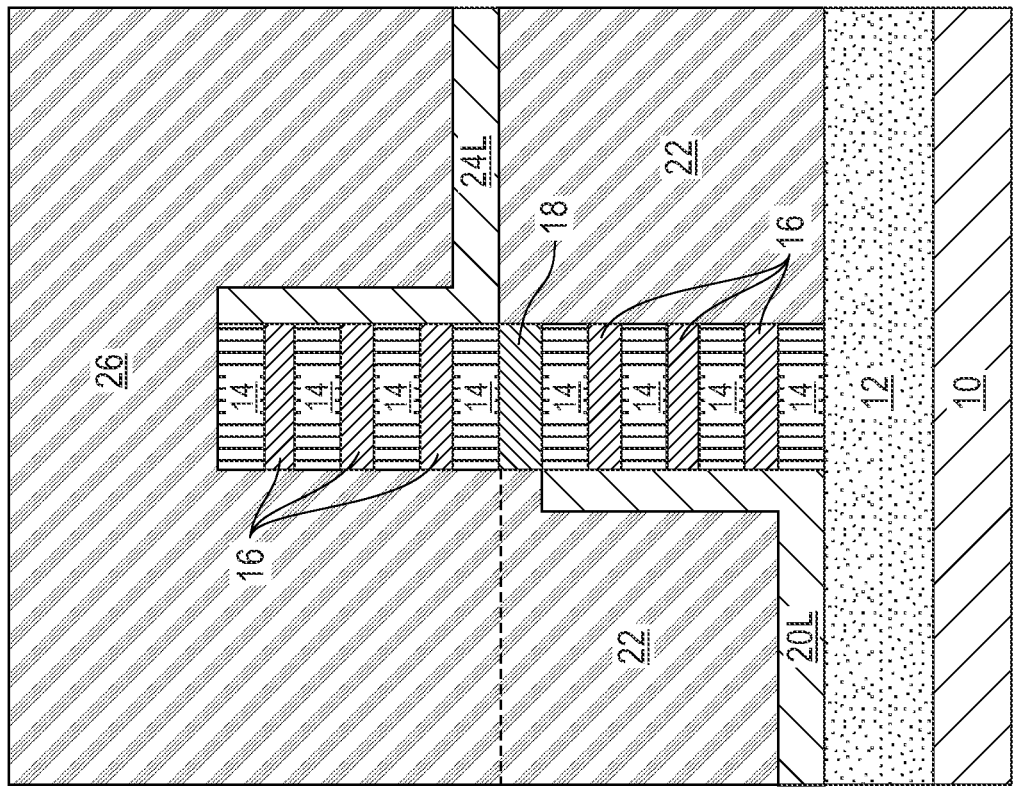
FIGS. 8A and 8B are cross sectional views of the exemplary semiconductor structure shown in FIGS. 7A and 7B, respectively, after patterning the first nanosheet material stack, the sacrificial placeholder material layer, and the second nanosheet material stack.
Figure 8A:
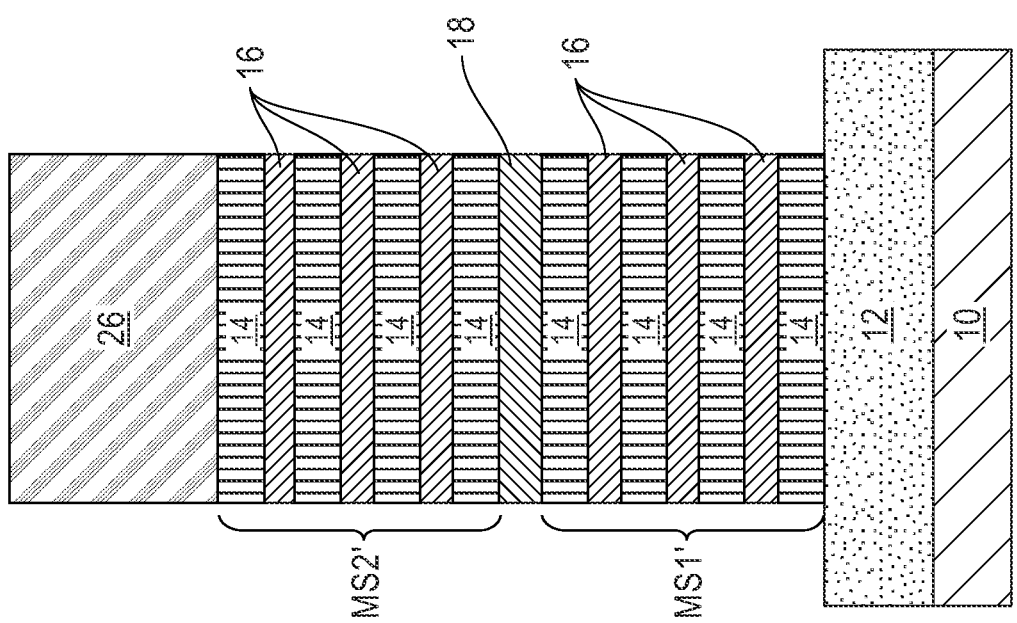

Referring now to FIGS. 8A and 8B, there are illustrated the exemplary semiconductor structure shown in FIGS. 7A and 7B, respectively, after patterning the first nanosheet material stack MS1, the sacrificial placeholder material layer 18, and the second nanosheet material stack MS2 (i.e., the vertical stack). This step of the present application includes a 2 times gate pitch patterning process and an etch such as, for example, reactive ion etching (RIE). The 2 times gate pitch patterning is used in the present application to form a 'fat gate' having a gate size (i.e., length) that is larger than a targeted gate size (i.e., length), and the gate pitch is doubled. By forming 'fat' gates with a larger size, it improves the mechanical stability of the stacked FET device even when the total height of first material MS1, the sacrificial placeholder material layer 18 and the second material stack MS2 is tall. FIG. 8A shows that the length of the original vertical stack shown in FIG. 2A has been reduced by this step.

After this gate patterning process, a patterned vertical stack having a desired gate pitch is provided that includes patterned first nanosheet material stack MS1' (i.e., a non-etched portion of the first nanosheet material stack MS1) and a patterned second nanosheet material stack MS2' (i.e., a remaining non-etched portion of the second nanosheet material stack MS2). The patterned first nanosheet material stack MS1' is spaced apart from the patterned second nanosheet material stack MS2' by a patterned portion of the sacrificial placeholder material layer 18. Each of the patterned first nanosheet material stack MS1' and the patterned stack nanosheet material stack MS2' includes a patterned portion of the sacrificial semiconductor material layers 14, and a patterned portion of semiconductor channel material layers 16.

Referring now to FIGS. 9A and 9B, there are illustrated the exemplary semiconductor structure shown in FIGS. 8A and 8B, respectively, after replacing the patterned sacrificial placeholder material layer 18 of the patterned vertical stacks with a dielectric isolation layer 28.

The patterned sacrificial placeholder material layer 18 can be removed utilizing an etching process that is selective in removing the third semiconductor material that provides the patterned sacrificial placeholder material layer 18; the patterned sacrificial semiconductor material layers 14 and the patterned semiconductor channel material layers 16 are not removed by this etch, nor are the first sacrificial liner 20L, the second sacrificial liner 24L, the first dielectric material layer 22 and the second dielectric material layer 26.

The removal of the patterned sacrificial placeholder material layer 18 creates a void (not shown) between the patterned first nanosheet material stack MS1' and the patterned second nanosheet material stack MS2'. This void is then filled with a dielectric material to provide dielectric isolation layer 28. The dielectric material that provides the dielectric isolation layer 28 is compositionally different from the first and second dielectric material layers 22 and 26, respectively, as well as being compositionally different from the material of the first and second sacrificial liners 20L and 24L, respectively. The filling of the void can include a deposition process such as, for example, CVD, PECVD or PVD. An etch can be used to remove any deposited dielectric material that is present outside of the void. The dielectric isolation layer 28 has a width that is the same as the patterned sacrificial semiconductor material layers 14 and the patterned semiconductor channel material layers 16.

Figure 10B:
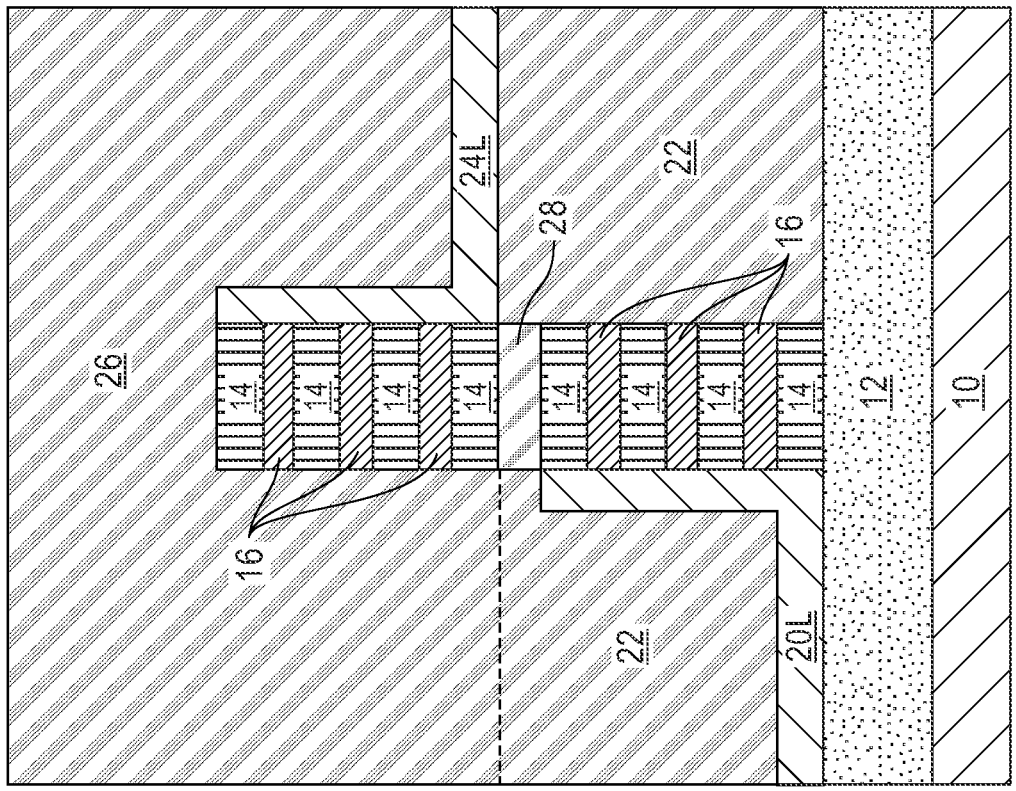
FIGS. 10A and 10B are cross sectional views of the exemplary semiconductor structure shown in FIGS. 9A and 9B, respectively, after recessing each patterned sacrificial semiconductor material layer of the patterned first nanosheet material stack and the patterned second nanosheet material stack, and forming a first inner spacer in each gap created by this recessing process.
Figure 10A:
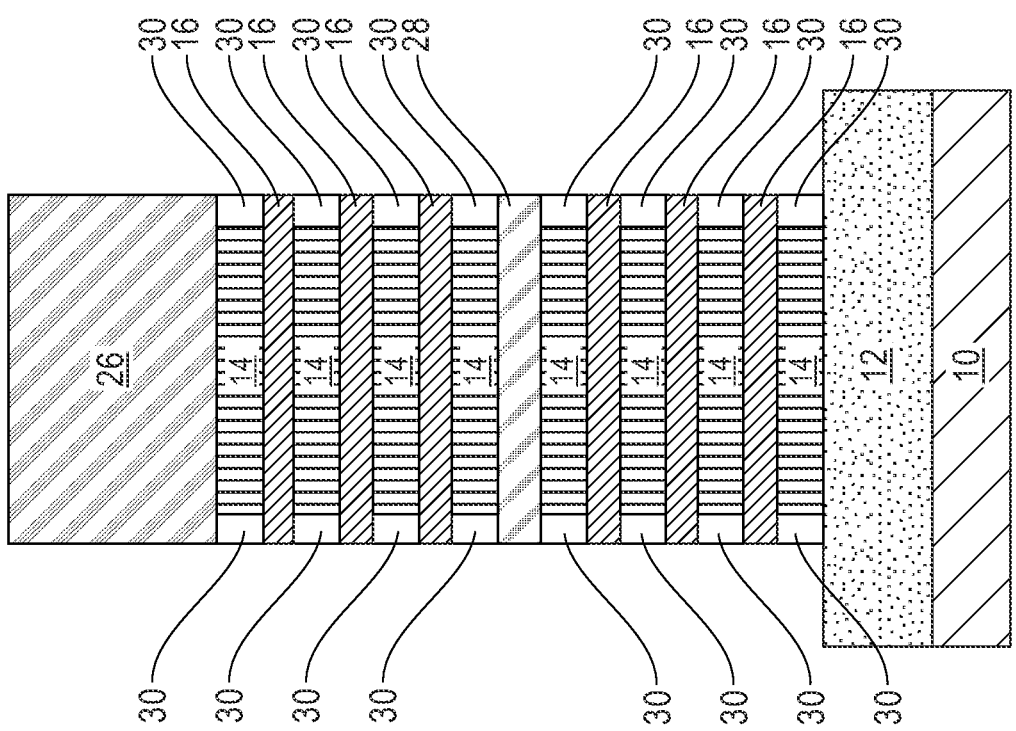

Referring now to FIGS. 10A and 10B, there are illustrated the exemplary semiconductor structure shown in FIGS. 9A and 9B, respectively, after recessing each patterned sacrificial semiconductor material layer 14 of the patterned first nanosheet material stack MS1' and the patterned second nanosheet material stack MS2', and forming a first inner spacer 30 in each gap created by recessing process.

Notably, end portions of each of the patterned sacrificial semiconductor material layers 14 are recessed to form a gap (not shown). The recessing includes a lateral etching process. First inner spacer 30 is then formed in each gap created by the recessing of each patterned sacrificial semiconductor material layer 14. The forming of the first inner spacers 30 includes conformal deposition of a dielectric spacer material, followed by an isotropic etching. The dielectric spacer material is compositionally different from at least the material that provides the first and second sacrificial liners 20L and 24L, respectively. The dielectric spacer material can include silicon dioxide, silicon nitride, silicon oxynitride, or a low-k dielectric material (i.e., a dielectric material having a dielectric constant of less than 4.0). The dielectric spacer material that provides the first inner spacers 30 can be compositionally the same as, or compositionally different from, the dielectric material that provides the first dielectric material layer 22 and/or the dielectric material that provides the second dielectric material layer 26. Each first inner spacer 30 has an outermost sidewall that is vertically aligned to each of the patterned semiconductor channel material layers 16, and an innermost sidewall that is in direct physical contact with one of the recessed and patterned sacrificial semiconductor material layers 14.

Figure 11B:
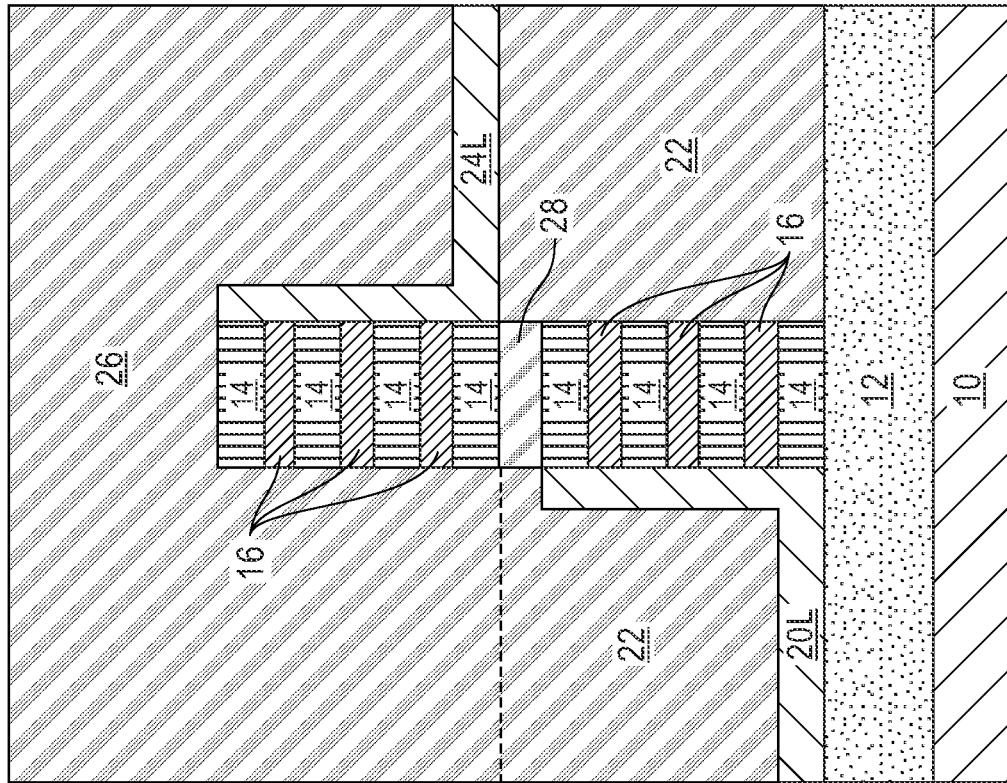
FIGS. 11A and 11B are cross sectional views of the exemplary semiconductor structure shown in FIGS. 10A and 10B, respectively, after forming a first source/drain region of first conductivity laterally adjacent to the patterned first nanosheet material stack, and a second source/drain region of second conductivity, different from the first conductivity, laterally adjacent to the patterned second nanosheet material stack.
Figure 11A:
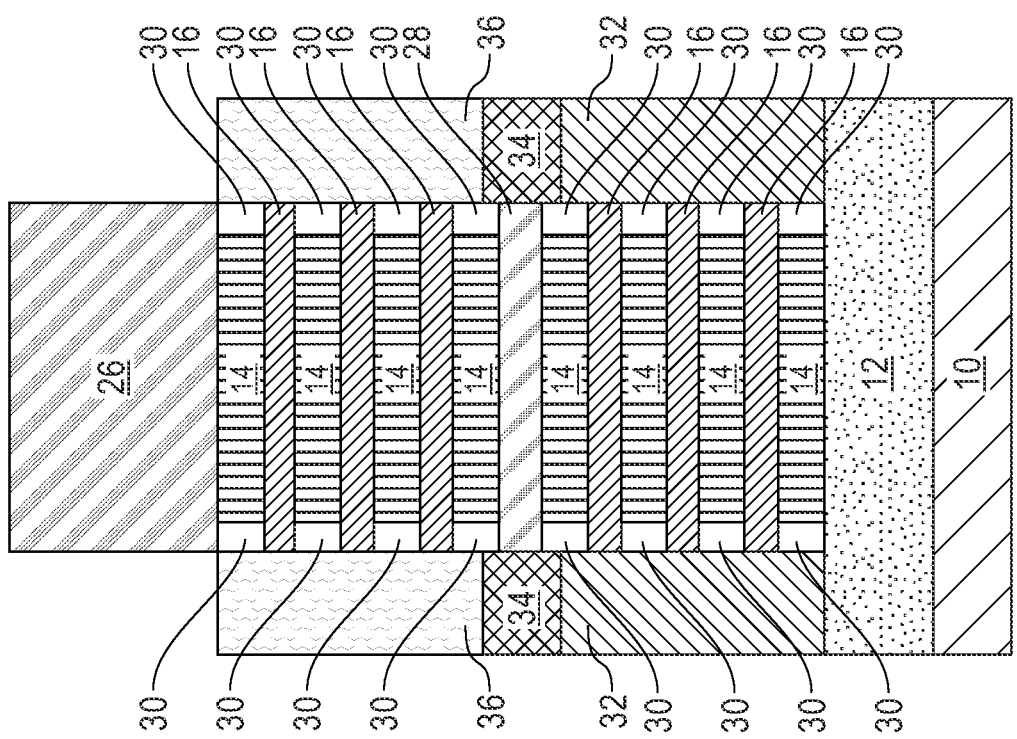

Referring now to FIGS. 11A and 11B, there are illustrated the exemplary semiconductor structure shown in FIGS. 10A and 10B, respectively, after forming a first source/drain region 32 of first conductivity laterally adjacent to the patterned first nanosheet material stack MS1', and a second source/drain region 36 of second conductivity, different from the first conductivity, laterally adjacent to the patterned second nanosheet material stack MS2'. As is illustrated in FIG. 11A, a source/drain isolation layer 34 is formed between the first source/drain region 32 and the second source/drain region 36.

As used herein, a "source/drain" region can be a source region or a drain region depending on subsequent wiring and application of voltages during operation of the CFET. The first source/drain region 32 has a sidewall that is in direct physical contact with the outermost sidewalls of each patterned semiconductor channel material layer 16 of the patterned first nanosheet material stack MS1'. The second source/drain region 36 has a sidewall that is in direct physical contact with the outermost sidewalls of each patterned semiconductor channel material layer 16 of the patterned second nanosheet material stack MS2'. The source/drain isolation layer 34 has a sidewall that in direct physical contact with an outermost sidewall of the dielectric isolation layer 28. Each of the first source/drain region 32, the source/drain isolation layer 34, and the second source/drain region 36 is located on both sides of the patterned vertical stack containing the patterned first nanosheet material stack, MS1', the dielectric isolation layer 28, and the patterned second nanosheet material stack MS2'.

Each of the first source/drain region 32 and the second source/drain region 36 includes a semiconductor material and a dopant. The semiconductor material that provides first source/drain region 32 and the second source/drain region 36 can include Si, SiGe, SiC, or combination of those materials. The dopant that is present in the first source/drain region 32 has an opposite conductivity as compared to the dopant present in the second source/drain region 36. In one embodiment, the dopant that is present in the first source/drain region 32 can be a p-type dopant, while the dopant that is second source/drain region 36 can be an n-type dopant. In other embodiment, the dopant that is present in the first source/drain region 32 can be an n-type dopant, while the dopant that is second source/drain region 36 can be a p-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region 28 can have a dopant concentration of from $4 \times 10^{20}$ atoms/cm$^3$ to $\times 10^{21}$ atoms/cm$^3$.

Each of the first source/drain region 32 and the second source/drain region 36 can be formed by an epitaxial growth in which the dopants are present during the epitaxial growth process. A recess etch can be employed so as to reduce the height of each of the first source/drain region 32 so as to remove the first source/drain region 32 from the top of second patterned nanosheet stack MS2;

The source/drain isolation layer 34 is composed of a dielectric material such as, for example, silicon dioxide, silicon nitride, and/or silicon oxynitride. The source/drain isolation layer 34 can be formed by a deposition process such as, for example, CVD, PECVD, ALD, or PVD. The source/drain isolation layer 34 can have a thickness from 5 nm to 20 nm; although other thicknesses from the source/drain isolation layer 34 are contemplated and can be used as the present application. The source/drain isolation layer 34 typically has a thickness that is greater or equal to the thickness of the dielectric isolation layer 28.

Figure 12B:
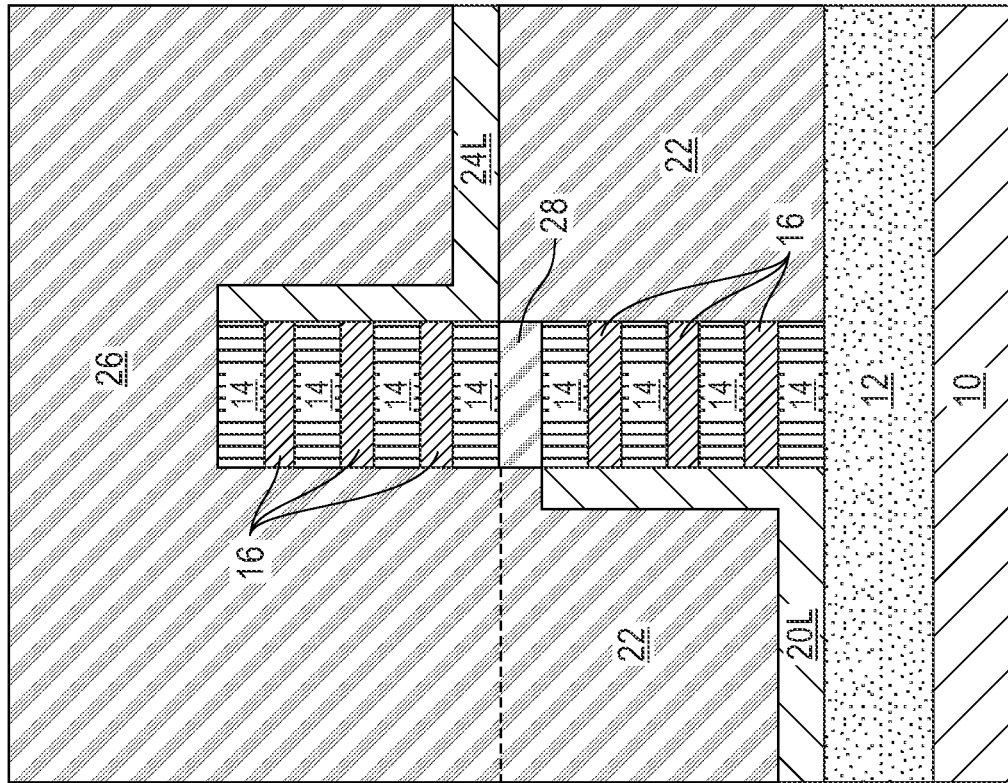
FIGS. 12A and 12B are cross sectional views of the exemplary semiconductor structure shown in FIGS. 11A and 11B, respectively, after forming an interlayer dielectric material layer on a surface of the second source/drain region.
Figure 12A:
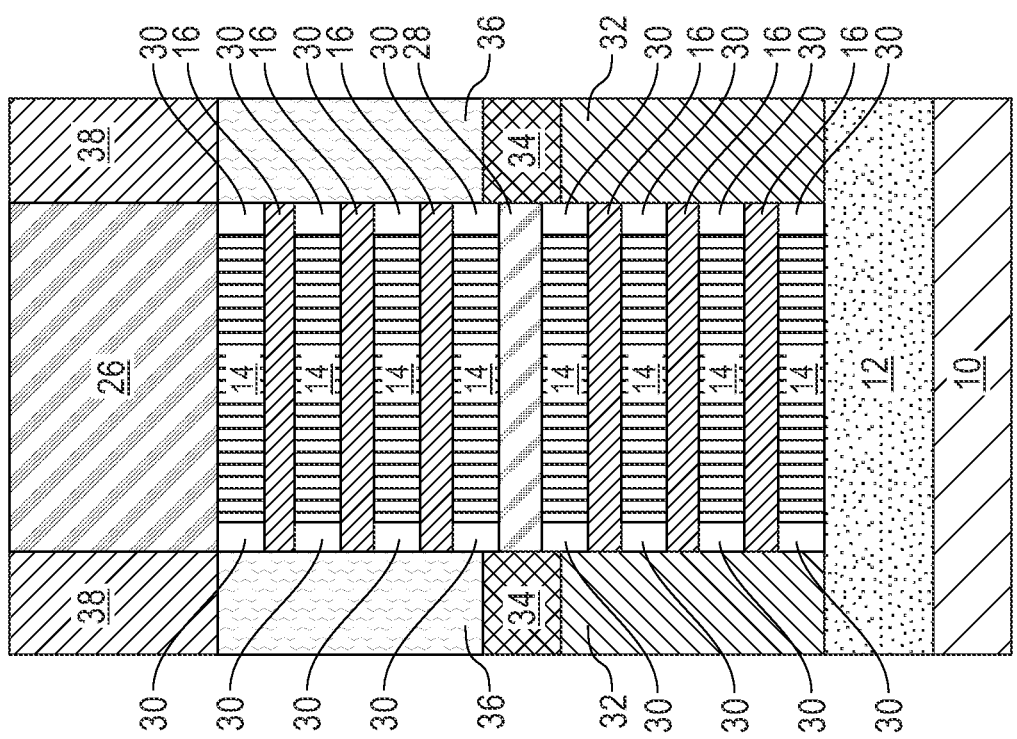

Referring now to FIGS. 12A and 12B, there are illustrated the exemplary semiconductor structure shown in FIGS. 11A and 11B, respectively, after forming an interlayer dielectric (ILD) material layer 38 on a surface of the second source/drain region 36. The ILD material layer 38 can have a topmost surface that is substantially coplanar with a topmost surface of the second dielectric material layer 36 that is present over the patterned vertical stack. The ILD material layer 38 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. Although not shown, the ILD material layer 38 can include a multilayered structure that includes at least two different dielectric materials stacked one atop the other such as, for example, silicon nitride and silicon dioxide. The ILD material layer 38 can be formed by a deposition process such as, for example, CVD, PECVD, or spin-on coating. A planarization process such as, for example, CMP, can be performed after the deposition of the dielectric material that provides the ILD material layer 38. The dielectric material that provides the ILD material layer is compositionally different from the dielectric material that provides the second dielectric material layer 26 so that the second dielectric material layer 26 can be selectively recessed with respect to the ILD material layer 38.

Referring now to FIGS. 13A and 13B, there are illustrated the exemplary semiconductor structure shown in FIGS. 12A and 12B, respectively, after recessing the second dielectric material layer 26. Recessing the second dielectric material layer 26 is performed to reduce the height of the second dielectric material layer 26 that is present over the patterned vertical stack. This recessing creates an opening 40 atop the patterned vertical stack and between portions of the ILD material layer 38; See, for example, FIG. 13A. The recessing of the second dielectric material layer 26 can be performed utilizing a recess etch that is selective in removing the dielectric material that provides the second dielectric material layer 26. A portion of the second dielectric material layer 26 remains atop the patterned vertical stack as is shown, for example, in FIG. 13A.

Referring now to FIGS. 14A and 14B, there are illustrated the exemplary semiconductor structure shown in FIGS. 13A and 13B, respectively, after forming a top spacer 42 on the recessed second dielectric material layer 26, and forming an opening 44 through the patterned second nanosheet material stack MS2', the dielectric isolation layer 28 and the patterned first nanosheet material stack MS1' utilizing the top spacer 42 as an mask to provide a pair of spaced apart stacked structures, each stacked structure of the pair of stacked structures including a first nanosheet stack NS1 and a second nanosheet stack NS2 separated by a dielectric isolation nanosheet 28NS, and each of the first nanosheet stack NS1 and the second nanosheet stack NS2 including alternating sacrificial semiconductor material nanosheets 14NS and semiconductor channel material nanosheets 16NS.

Since supporting structures such, as for example, the first source/drain region 32, the source/drain isolation layer 34 and the second source/drain region 36 are present, this step of the present application is employed to divide the gate length into two to achieve a targeted gate length. In this step of the present application, the width of the top spacer 42 defines gate length plus 2× the inner spacer width. Thus, each of the first nanosheet stack NS1 and the second nanosheet stack NS2 has a targeted gate length.

The top spacer 42 is composed of a dielectric spacer material including, for example, silicon dioxide, silicon nitride or silicon oxynitride. The dielectric spacer material that provides the top spacer 40 can be compositionally the same as, or compositionally different from, the dielectric spacer material that provides the first inner spacer 30. The top spacer 42 can be formed by depositing a dielectric spacer material, followed by a spacer etch.

After forming top spacer 42, opening 44 is formed by utilizing one or more etching processes. The one or more etching processes can include dry etching, wet etching or any combination thereof. In one example, a series of reactive ion etching processes can be used in forming the opening 44. In one embodiment and as is illustrated in FIG. 14A, the one or more etching processes used to provide the opening 44 stops on a surface of dielectric material layer 12. In other embodiments not shown, the one or more etching processes used to provide the opening 22 stops on a surface of buried insulator layer or the semiconductor substrate 10.

The one or more etching processes remove physically exposed portions of the recessed second dielectric material layer 26, the patterned second nanosheet material stack MS2', the dielectric isolation layer 28 and the patterned first nanosheet material stack MS1' that are not covered by the top spacer 42. After the one or more etching processes, portions of the recessed second dielectric material layer 26, the patterned second nanosheet material stack MS2', the dielectric isolation layer 28 and the patterned first nanosheet material stack MS1' remain under the top spacer 42 and on either side of the opening 44. Each remaining portion of the recessed second dielectric material layer 26 can be referred to as a recessed second dielectric material portion (in the drawings element 26 is still used to referred to the recessed second dielectric material portions), each remaining portion of a patterned second nanosheet material stack MS2' can be referred to as second nanosheet stack NS2, each remaining portion of the recessed dielectric isolation layer 28 is referred to as dielectric isolation nanosheet 28NS, and each remaining portion of the patterned first nanosheet material stack MS1' can be referred to as first nanosheet stack NS1.

Within the patterned second nanosheet material stack MS2' and the patterned first nanosheet material stack MS1', portions of the laterally etched and patterned sacrificial semiconductor material layers 14 and the patterned semiconductor channel material layers 16 that are not covered by the top spacer 42 are also removed during the one or more etching processes used in providing opening 44. After the one or more etching processes, portions of the laterally etched and patterned sacrificial semiconductor material layers 14 and the patterned semiconductor channel material layers 16 remain under the top spacer 42 and on either side of the opening 44. Each remaining portion of the laterally etched and patterned sacrificial semiconductor material layers 14 can be referred to as sacrificial semiconductor material nanosheet 14NS and each remaining portion of the patterned semiconductor channel material layers 16 can be referred to as semiconductor channel material nanosheet 16NS.

Figure 15B:
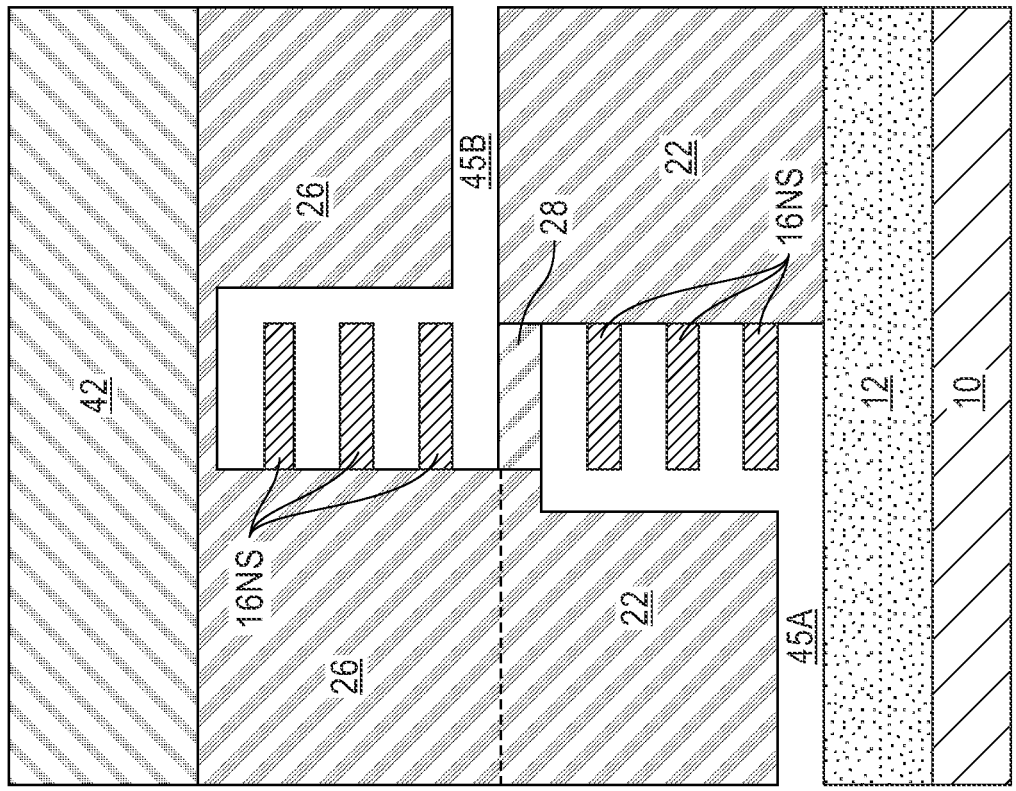
FIGS. 15A and 15B are cross sectional views of the exemplary semiconductor structure shown in FIGS. 14A and 14B, respectively, after removing each sacrificial semiconductor material nanosheets of the first and second nanosheet stacks of the pair of stacked structures, and removing the first sacrificial liner and the second sacrificial liner.
Figure 15A:
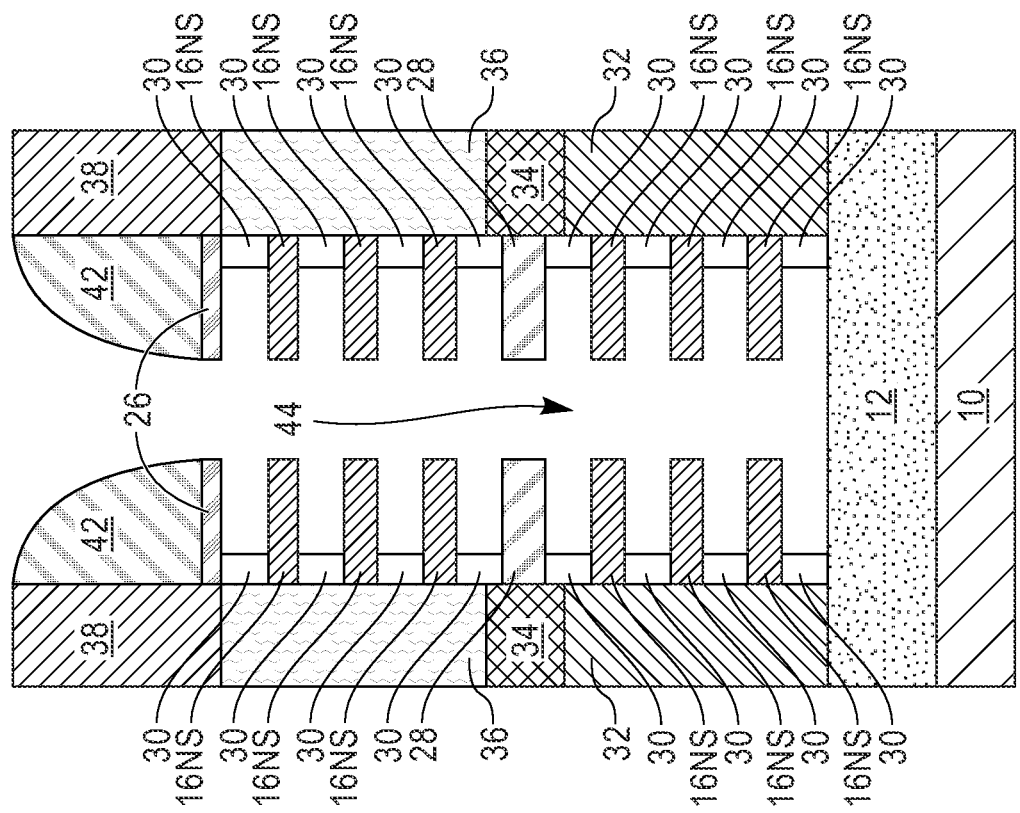

Referring now to FIGS. 15A and 15B, there are illustrated the exemplary semiconductor structure shown in FIGS. 14A and 14B, respectively, after removing each sacrificial semiconductor material nanosheets 14NS of the first and second nanosheet stacks NS1 and NS2, respectively, of the pair of stacked structures, and removing the first sacrificial liner 20L and the second sacrificial liner 24L. The removal of each sacrificial semiconductor material nanosheets 14NS of the first and second nanosheet stacks NS1 and NS2, respectively, of the pair of stacked structures can include an etching process that is selective in removing the sacrificial semiconductor material relative to the semiconductor channel material. The removal of each sacrificial semiconductor material nanosheets 14NS of the first and second nanosheet stacks NS1 and NS2, respectively, of the pair of stacked structures suspends each semiconductor channel material nanosheet 16NS that is present in the first and second nanosheet stacks NS1 and NS2, respectively; See FIG. 15A.

The removal of the first sacrificial liner 20L and the second sacrificial liner 24L can include one or more etching processes that selectively remove the first sacrificial liner 20L and the second sacrificial liner 24L. The removal of the first sacrificial liner 20L forms a first cavity 45A that accesses the suspended semiconductor channel material nanosheets 16NS that are present in the first nanosheet stack NS1, while the removal of the second sacrificial liner 24L forms a second cavity 45B that accesses the suspended semiconductor channel material nanosheets 16NS that are present in the second nanosheet stack NS2. The first cavity 45A is not connected to the second cavity 45B due to the presence of the dielectric isolation nanosheet 28NS.

Figure 16B:
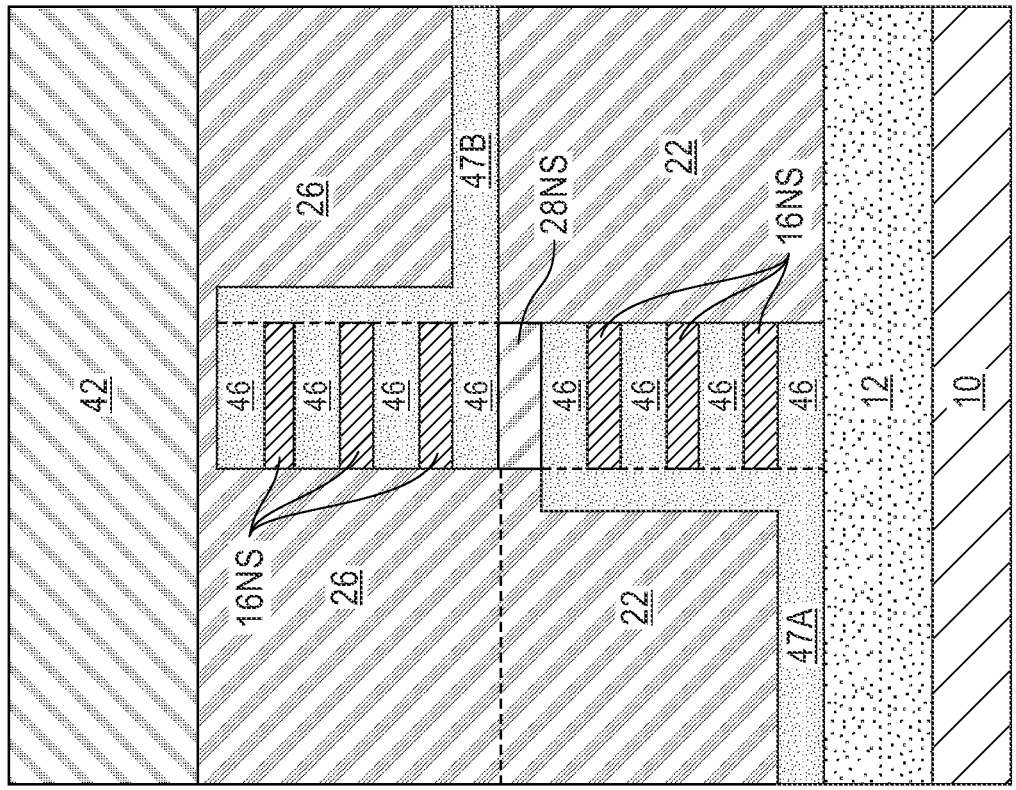
FIGS. 16A and 16B are cross sectional views of the exemplary semiconductor structure shown in FIGS. 15A and 15B, respectively, after forming a functional gate structure wrapping around each semiconductor channel material nanosheet of the first and second nanosheet stacks of the pair of stacked structures, wherein a portion of the functional gate structure is formed in the volume previously occupied by the first and second sacrificial liners.
Figure 16A:
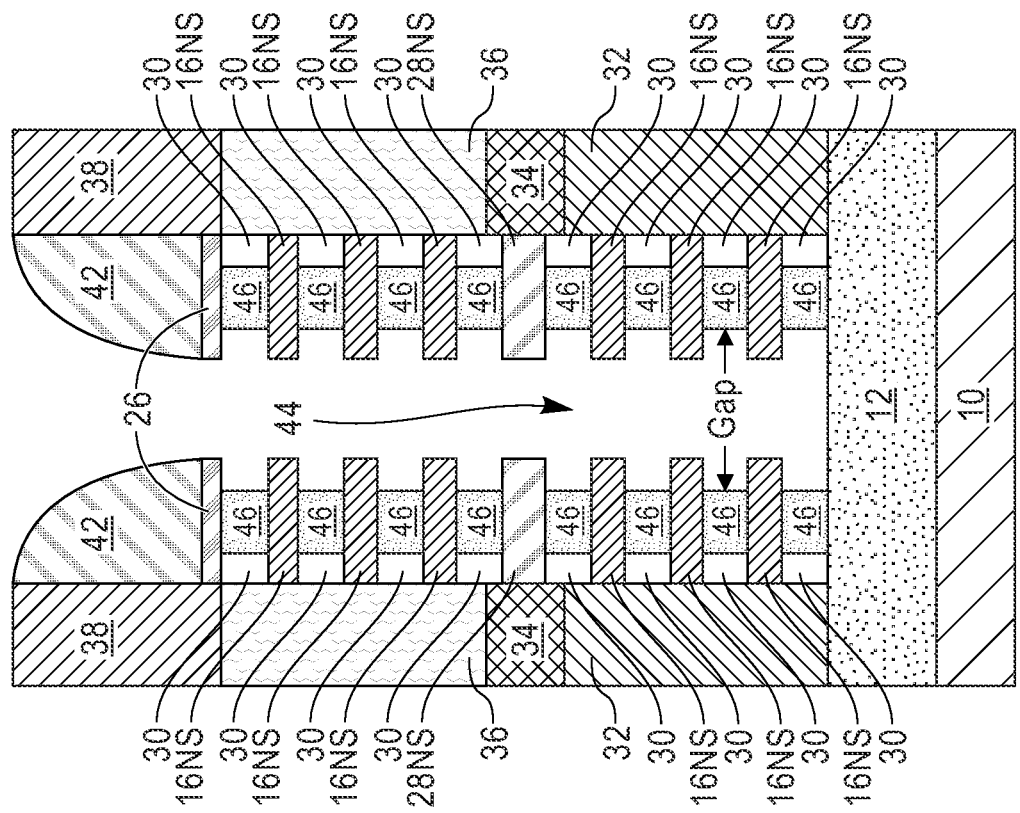

Referring now to FIGS. 16A and 16B, there are illustrated the exemplary semiconductor structure shown in FIGS. 15A and 15B, respectively, after forming a functional gate structure 46 wrapping around each semiconductor channel material nanosheet 16NS of the first and second nanosheet stacks, NS1 and NS2, respectively, of the pair of stacked structures, wherein a portion of the functional gate structure 46 is formed in the volume previously occupied by the first and second sacrificial liners 20L and 24L, respectively. After forming the functional gate structure 46, a lateral etch is performed to provide a gap for the formation of a second inner spacer.

The functional gate structure 46 includes at least a gate dielectric material layer 48 as shown in FIG. 17A and gate electrode 50 (gate electrode 50 can include a work functional metal (WFM) layer, or a combination of a WFM layer and a gate electrode material) as shown in FIG. 17A as well; both of which are not individually shown in FIGS. 16A, 16B and 17B but collectively identified as the functional gate structure 46 in those drawings. As is known, the gate dielectric material layer of the functional gate structure 46 is in direct contact with physically exposed portions of each semiconductor channel material nanosheet 16NS of the first and second nanosheet stacks, NS1 and NS2, respectively, of the pair of stacked structures, and the gate electrode is located on the gate dielectric material layer. In some embodiments, the functional gate structure 46 includes a work function metal (WFM) layer located between the gate dielectric material layer and the gate electrode.

The functional gate structure 46 includes forming a continuous layer of gate dielectric material, a WFM layer and, optionally, a gate electrode material inside and outside opening 44 including the suspended semiconductor channel material nanosheets 16NS of the first and second nanosheet stacks, NS1 and NS2, respectively, of the pair of stacked structures; the continuous layer of gate dielectric material, a WFM layer and optionally a gate electrode material is also formed inside the first and second cavities 45A and 45B, respectively. The continuous layer of gate dielectric material can include silicon oxide, or a dielectric material having a dielectric constant greater than silicon oxide (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The high-k gate dielectric material can further include dopants such as lanthanum (La), aluminum (Al) and/or magnesium (Mg). The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_x$), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM can be formed on the continuous layer of gate dielectric material prior to forming the gate electrode material. In other embodiments, the gate electrode is composed of only a WFM. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The layer of WFM is a conformal layer which can be formed by a conformal deposition process such as, for example, ALD, CVD or PECVD. The layer of WFM layer can have a thickness in the range of 1 nm to 20 nm, although other thickness above or below this range may be used as desired for a particular application.

After forming the continuous layer of the gate dielectric material, the layer of WFM and the gate electrode material, an isotropic etch back process, for example, wet etch or plasma dry etch, is used to remove the exposed layer of the gate dielectric material, the layer of WFM and the gate electrode material from outside opening 44. The remaining continuous layer of the gate dielectric material that is present inside opening 44 can be referred to as a gate dielectric material layer, the remaining layer of WFM that is present inside the opening 44 can be referred to a WFM layer, and remaining gate electrode material that is present inside the opening can be referred as a gate conductor. In some embodiments, and as mentioned above, the WFM layer can be used as the gate electrode 50, while in other embodiments, the WFM layer and the gate conductor collective provide gate electrode 50.

Within the first cavity 45A, gate dielectric material layer, WFM layer and optional gate electrode material also remains and provide a first functional gate-containing liner 47A. The first functional gate-containing liner 47A has a vertical extending portion that is located laterally adjacent to, and directly contacting an end of each suspended semiconductor channel material nanosheet 16NS that is present in the first nanosheet stack NS1 of each stacked structure; the vertical extending portion of first functional gate-containing liner 47A extends upward from a horizontal portion of the first functional gate-containing liner 47A. Another end of each suspended semiconductor channel material nanosheet 16NS, opposite the end contacting the first functional gate-containing liner 47A, that is present in the first nanosheet stack NS1, is located laterally adjacent to, and directly contacting the first dielectric material layer 22. It is noted that the first functional gate-containing liner 47A also contacts the functional gate structure 46 that wraps around the suspended semiconductor channel material nanosheets 16NS that are present in the first nanosheet stack NS1 of each stacked structure. The first functional gate-containing liner 47A and the functional gate structure 46 that wraps around the suspended semiconductor channel material nanosheets 16NS that are present in the first nanosheet stack NS1 of each stacked structure are of unitary construction and represent a single work piece. In the drawings, a dotted line is shown to depict a hypothetical boundary between the first functional gate-containing liner 47A and the functional gate structure 46 that wraps around the suspended semiconductor channel material nanosheets 16NS that are present in the first nanosheet stacks, NS1 of each stacked structure. Collectively, the first functional gate-containing liner 47A and the functional gate structure 46 that wraps around the suspended semiconductor channel material nanosheets 16NS that are present in the first nanosheet stack NS1 of each stacked structure provide a first gate structure of a first (or lower) nanosheet device of a first conductivity type.

Within the second cavity 45B, gate dielectric material layer, WFM layer and optional gate electrode material also remains and provide a second functional gate-containing liner 47B. The second functional gate-containing liner 47B has a vertical extending portion that is located laterally adjacent to, and directly contacting an end of each suspended semiconductor channel material nanosheet 16NS that is present in the second nanosheet stack NS2 of each stacked structure; the vertical extending portion of second functional gate-containing liner 47B extends upward from a horizontal portion of the second functional gate-containing liner 47B. Another end of each suspended semiconductor channel material nanosheet 16NS, opposite the end contacting the second functional gate-containing liner 47B, that is present in the second nanosheet stack NS2, is located laterally adjacent to, and directly contacting the second dielectric material layer 26. It is noted that the second functional gate-containing liner 47B also contacts the functional gate structure 46 that wraps around the suspended semiconductor channel material nanosheets 16NS that are present in the second nanosheet stack NS2 of each stacked structure. The second functional gate-containing liner 47B and the functional gate structure 46 that wraps around the suspended semiconductor channel material nanosheets 16NS that are present in the second nanosheet stacks NS2 of each stacked structure are of unitary construction and represent a single work piece. In the drawings, a dotted line is shown to depict a hypothetical boundary between the second functional gate-containing liner 47B and the functional gate structure 46 that wraps around the suspended semiconductor channel material nanosheets 16NS that are present in the first nanosheet stack NS2 of each stacked structure. Collectively, the second functional gate-containing liner 47B and the functional gate structure 46 that wraps around the suspended semiconductor channel material nanosheets 16NS that are present in the second nanosheet stack NS2 of each stacked structure provide a second gate structure of a second (or upper) nanosheet device of a second conductivity type, that is opposite from the first conductivity type. In one embodiment, the first conductivity type is p-type, while the second conductivity type is n-type. In another embodiment, the first conductivity type is n-type, while the second conductivity type is p-type.

It is noted that each nanosheet device of the present application including the semiconductor channel material nanosheets 16NS and the functional gate structure is a tri-gate device, where the functional gate structure wraps around three surfaces of each of the semiconductor channel material nanosheets 16NS, and the other surface of each of the semiconductor channel material nanosheets 16NS is not connected to a functional gate structure, but to a dielectric material (i.e., first dielectric material layer 22 or second dielectric material layer 26).

Referring now to FIGS. 17A and 17B, there are illustrated the exemplary semiconductor structure shown in FIGS. 16A and 16B, respectively, after forming second inner spacers 52, first source/drain region 32 of the first conductivity, and second source/drain region 36 of the second conductivity, different from the first conductivity, in the opening 44. As is illustrated in FIG. 17A, a source/drain isolation layer 34 is formed between the first source/drain region 32 and second source/drain region 36 that are formed in the opening 44.

Second inner spacers 52 are located at one end of the portion of the functional gate structure 46 that is located between each semiconductor channel material nanosheet 16NS, the first inner spacers 30 are located at the other end of the portion of the functional gate structure 46 that is located between each semiconductor channel material nanosheet 16NS. See, FIG. 17A, for example. As is shown in an insert to FIG. 17A, the gate dielectric material layer 48 is located along a sidewall of first inner spacers 30, but not along the sidewalls of the second inner spacers 52. The second inner spacers 52 include one of the dielectric spacer materials mentioned above for the first inner spacer 30. The dielectric spacer material that provides the second inner spacers 52 can be compositionally the same as, or compositionally different from, the dielectric spacer material that provides the first inner spacers 30. The formation of the second inner spacers 52 includes conformal deposition of a dielectric spacer material and followed by an isotropic etching. The second inner spacers 52 can have a width that is equal to, less than or greater to a width of the first inner spacers 30.

The first source/drain region 32 of the first conductivity, the second source/drain region 36 of the second conductivity, and the source/drain isolation layer 34 that are formed in the opening 44 are the same as mentioned above for forming the first source/drain region 32 of the first conductivity, the second source/drain region 36 of the second conductivity, and the source/drain isolation layer 34 shown in FIG. 11A. Thus, the materials and techniques used in forming the first source/drain region 32 of the first conductivity, the a second source/drain region 36 of the second conductivity, and the source/drain isolation layer 34 shown in FIG. 11A can be used here to form the first source/drain region 32 of the first conductivity, the second source/drain region 36 of the second conductivity, and the source/drain isolation layer 34 that are formed in the opening 44.

Figure 18B:
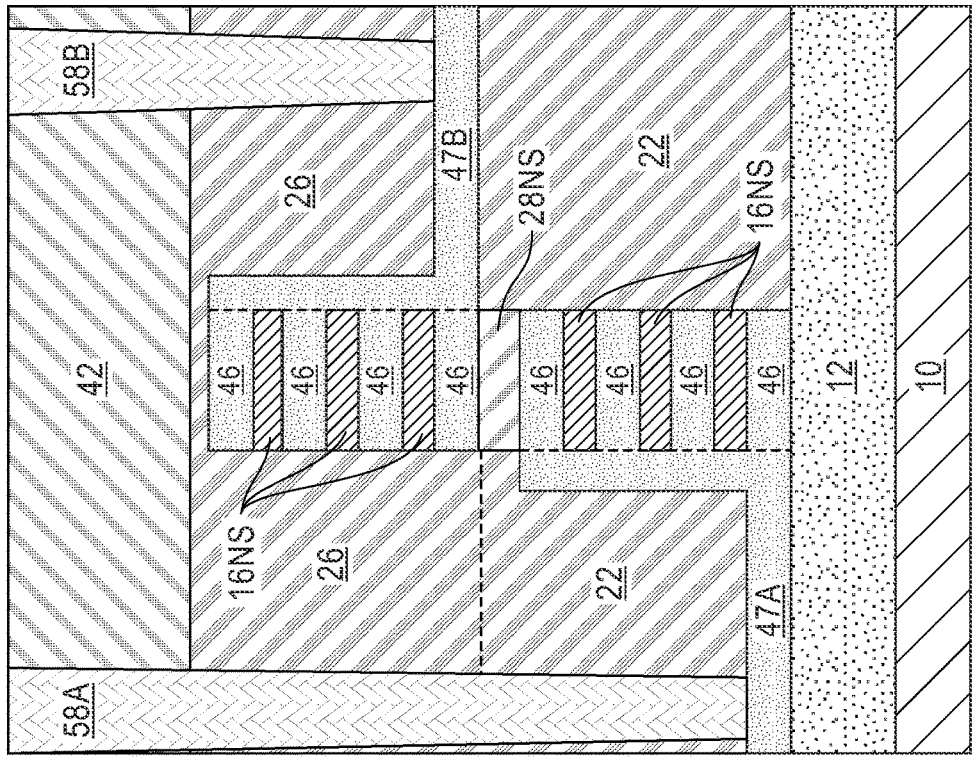
FIGS. 18A and 18B are cross sectional views of the exemplary semiconductor structure shown in FIGS. 17A and 17B, respectively, after forming contact structures.
Figure 18A:
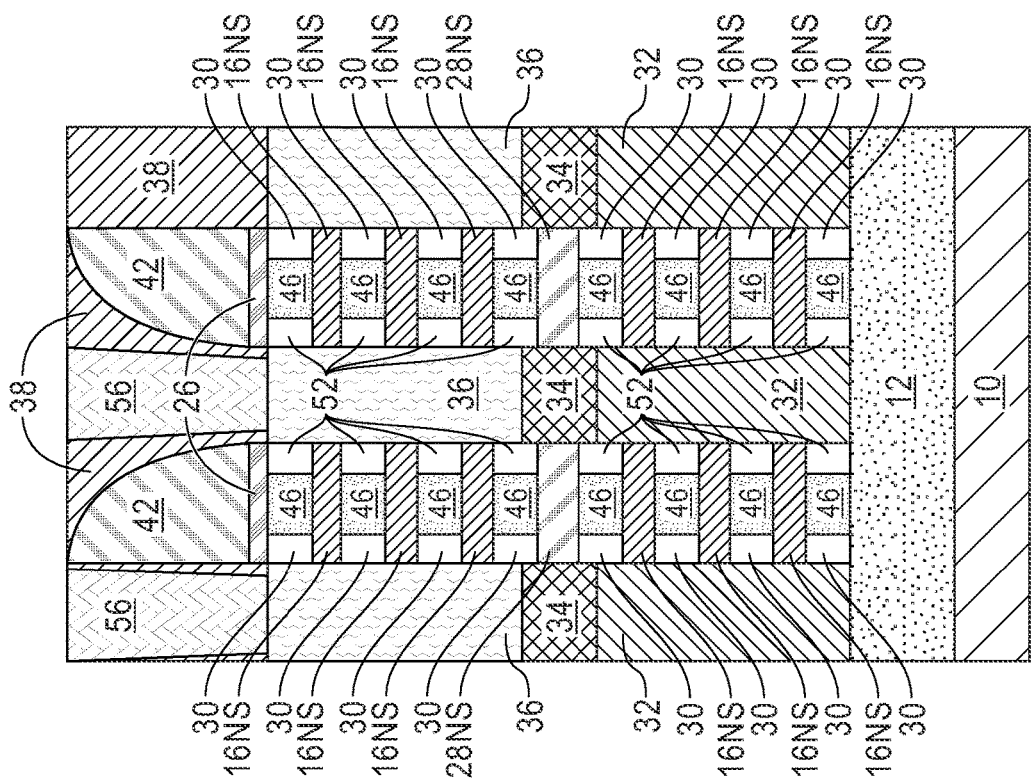
Figure 18C:
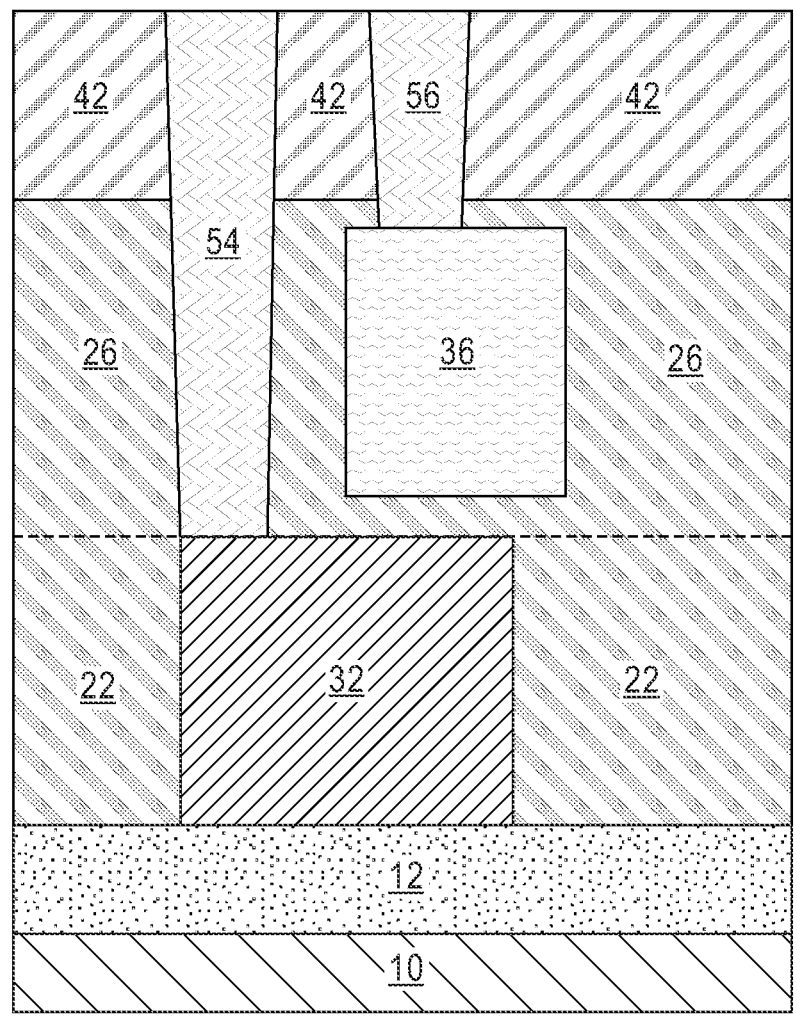
FIG. 18C is a cross sectional view of the exemplary semiconductor structure shown in FIGS. 18A and 18B and through cut Z-Z shown in FIG. 1.

Referring now to FIGS. 18A and 18B, there are illustrated the exemplary semiconductor structure shown in FIGS. 17A and 17B, respectively, after forming contact structures 54, 56 and 58. FIG. 18C is a cross sectional view of the exemplary semiconductor structure shown in FIGS. 18A and 18B and through cut Z-Z shown in FIG. 1. Contact structure 54 shown in FIG. 18C can be referred to as a first source/drain contact structure since it contacts a surface of the first source/drain region 32. Each contact structure 56 shown in FIGS. 18A and 18C can be referred to a second source/drain contact structure since each contact structure 56 contacts a surface of the second source/drain region 36. Contact structure 58A can be referred to as a first gate contact structure since it contacts a conductive surface of the first functional gate-containing liner 47A. Contact structure 58B can be referred to a second gate contact structure since it contacts a conductive surface of the second functional gate-containing liner 47B. Each contact structure is composed of a contact conductor material, as defined below. Each contact structure can include a contact liner (not shown) located along a sidewall and bottom wall of the contact conductor material.

The contact structures 54, 56, 58A and 58B can be formed by forming ILD material layer 38 within the opening portion of opening 44. ILD material layer 38 that is formed in the upper portion of the opening 44 is the same as that described above. The ILD material layer 38 that is formed in the upper portion of the opening 44 can be formed by deposition, followed by an optional planarization process. Contact openings (not shown) are then formed by lithography and etching. Notably, contact openings are formed which physically expose a surface of the first source/drain region 32, a surface of the second source/drain region 36, a conductive surface of the first functional gate-containing liner 47A, and a conductive surface of the first functional gate-containing liner 47A. An optional diffusion barrier material and a conductive contact material are (is) then formed (i.e., deposited) into each of the contact openings. A planarization can follow the deposition of the optional diffusion barrier material and a conductive contact material.

In one or more embodiments in which a contact liner is present, the contact liner (not shown) can include a silicide liner, such as Ti, Ni, NiPt, etc., and a diffusion barrier material. Exemplary diffusion barrier materials include, but are not limited to, Ru, TiN, TaN, WN, WC, an alloy thereof, or a stack thereof such as Ti/TiN and Ti/WC. The contact liner can be formed utilizing a conformal deposition process including PVD, RFPVD, CVD or ALD. The contact liner that is formed can have a thickness ranging from 1 nm to 8 nm, although lesser and greater thicknesses can also be employed. The contact conductor material that provides each contact structure can include, but is not limited to, W, Cu, Al, Co, Ru, Mo, Os, Ir, Rh or an alloy thereof. The contact conductor material can be formed by any suitable deposition method such as, for example, ALD, CVD, PVD or plating.

Each contact structure has a topmost surface that is substantially coplanar with each other. Also, each contact structure has topmost surface that is coplanar with a topmost surface of the ILD material layer 38 as well as a topmost surface of the top spacer 42.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a second nanosheet device of a second conductivity type stacked vertically above a first nanosheet device of a first conductivity type, wherein the first conductivity type is different from the second conductivity type, and each of the first nanosheet device and the second nanosheet device comprises at least one suspended semiconductor channel material nanosheet having a first side and a second side that is opposite the first side;
a first dielectric material layer contacting the second side of the at least one suspended semiconductor channel material nanosheet of the first nanosheet device;
a first functional gate-containing liner of a first gate structure contacting the first side of the at least one suspended semiconductor channel material nanosheet of the first nanosheet device, wherein the first gate structure further comprises a functional gate structure that wraps around the at least one suspended semiconductor channel material nanosheet of the first nanosheet device;
a second dielectric material layer located on a surface of the first dielectric material layer and contacting the first side of the at least one suspended semiconductor channel material nanosheet of the second nanosheet device;
a second functional gate-containing liner of a second gate structure contacting the second side of the at least one suspended semiconductor channel material nanosheet of the second nanosheet device, wherein the second gate structure further comprises a functional gate structure that wraps around the at least one suspended semiconductor channel material nanosheet of the second nanosheet device;
a first inner spacer located adjacent to a first end of the functional gate structure that wraps around the at least one suspended semiconductor channel material nanosheet of each of the first nanosheet device and the second nanosheet device; and a second inner spacer located adjacent to a second end, opposite the first end, of the functional gate structure that wraps around the at least one suspended semiconductor channel material nanosheet of each of the first nanosheet device and the second nanosheet device, wherein the functional gate structure that wraps around the at least one suspended semiconductor channel material nanosheet of each of the first nanosheet device and the second nanosheet device comprises a gate dielectric material layer and a gate electrode, wherein the gate dielectric material layer is located along a sidewall of the first inner spacer, but not the second inner spacer.

2. The semiconductor structure of claim 1, wherein the first functional gate-containing liner and the second functional gate-containing liner both include a vertical extending portion that extends upward from an end of a horizontal portion.

3. The semiconductor structure of claim 2, wherein the functional gate structure that wraps around the at least one suspended semiconductor channel material nanosheet of the first nanosheet device contacts the vertical extending portion of the first functional gate-containing liner.

4. The semiconductor structure of claim 2, wherein the functional gate structure that wraps around the at least one suspended semiconductor channel material nanosheet of the second nanosheet device contacts the vertical extending portion of the second functional gate-containing liner.

5. The semiconductor structure of claim 2, further comprising a first gate contact structure contacting the horizontal portion of the first functional gate-containing liner, and a second gate contact structure contacting the horizontal portion of the second functional gate-containing liner.

6. The semiconductor structure of claim 1, wherein the first nanosheet device comprises a first source/drain region of a first conductivity extending laterally outward from sidewalls of the least one suspended semiconductor channel material nanosheet of the first nanosheet device, and the second nanosheet device comprises a second source/drain region of a second conductivity, opposite the first conductivity, extending laterally outward from sidewalls of the least one suspended semiconductor channel material nanosheet of the second nanosheet device.

7. The semiconductor structure of claim 6, further comprising a source/drain isolation layer located between the first source/drain region and the second source/drain region.

8. The semiconductor structure of claim 6, further comprising a first source/drain contact structure contacting a surface of the first source/drain region, and a second source/drain contact structure contacting a surface of the second source/drain region.

9. The semiconductor structure of claim 1, further comprising a dielectric isolation nanosheet located between the at least one suspended semiconductor channel material nanosheet of the first nanosheet device and the at least one suspended semiconductor channel material nanosheet of the second nanosheet device.

10. The semiconductor structure of claim 1, wherein the first inner spacer is compositionally different from the second inner spacer.

11. The semiconductor structure of claim 1, wherein the first inner spacer has a width that differs from a width of the second inner spacer.

12. The semiconductor structure of claim 1, wherein the functional gate structure that wraps around the at least one suspended semiconductor channel material nanosheet of the first nanosheet device and the first functional gate-containing liner are of unitary construction.

13. The semiconductor structure of claim 1, wherein the functional gate structure that wraps around the at least one suspended semiconductor channel material nanosheet of the second nanosheet device and the second functional gate-containing liner are of unitary construction.

14. The semiconductor structure of claim 1, wherein the first conductivity type is p-type, and the second conductivity type is n-type.

15. The semiconductor structure of claim 1, wherein the first conductivity type is n-type, and the second conductivity type is p-type.

16. The semiconductor structure of claim 1, wherein the first nanosheet device is located on a dielectric material.

* * * * *